(12) United States Patent
Chang et al.

(10) Patent No.: US 8,237,520 B2
(45) Date of Patent: Aug. 7, 2012

(54) CAPACITOR DEVICES WITH A FILTER STRUCTURE

(75) Inventors: Huey-Ru Chang, Hsinchu (TW); Min-Lin Lee, Hsinchu (TW); Jiin-Shing Perng, Hsinchu (TW); Sheng-Che Hung, Hsinchu (TW); Shinn-Juh Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 695 days.

(21) Appl. No.: 12/395,065

(22) Filed: Feb. 27, 2009

(65) Prior Publication Data
US 2009/0267704 A1    Oct. 29, 2009

Related U.S. Application Data

(60) Provisional application No. 61/032,777, filed on Feb. 29, 2008.

(51) Int. Cl.
*H03H 7/00* (2006.01)

(52) U.S. Cl. .......................................... 333/181; 333/185

(58) Field of Classification Search .................. 333/181, 333/185, 202, 204
See application file for complete search history.

(56) References Cited

U.S. PATENT DOCUMENTS

| | | | |
|---|---|---|---|
| 6,411,178 B1 * | 6/2002 | Matsumura et al. | 333/134 |
| 2007/0090398 A1 | 4/2007 | McKinzie, III | |

FOREIGN PATENT DOCUMENTS

CN    1418013 A    5/2003

OTHER PUBLICATIONS

Chien-Min Hsu et al., U.S. Appl. No. 12/392,272, filed Feb. 25, 2009.
Chien-Min Hsu et al., U.S. Appl. No. 12/390,237, filed Feb. 20, 2009.

* cited by examiner

*Primary Examiner* — Robert Pascal
*Assistant Examiner* — Kimberly Glenn
(74) *Attorney, Agent, or Firm* — Finnegan, Henderson, Farabow, Garrett & Dunner, LLP

(57) ABSTRACT

A capacitor device is provided. The capacitor device includes at least one capacitor. The capacitor device also includes a first capacitor and a first filter coupling the first capacitor and a conductive region, wherein the first capacitor has a first resonance frequency and the first filter is configured to operate at a first frequency band covering the first resonance frequency.

24 Claims, 23 Drawing Sheets

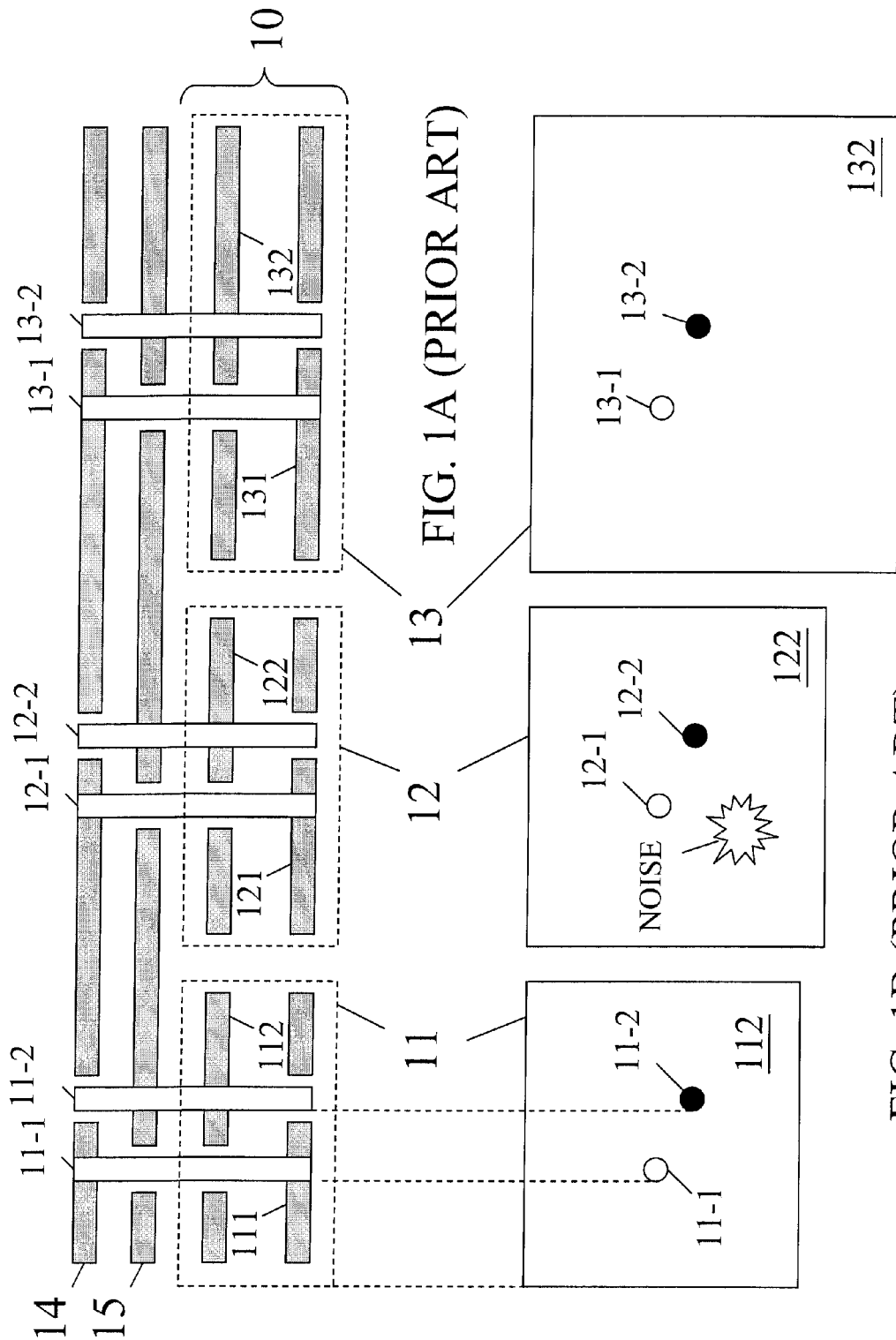

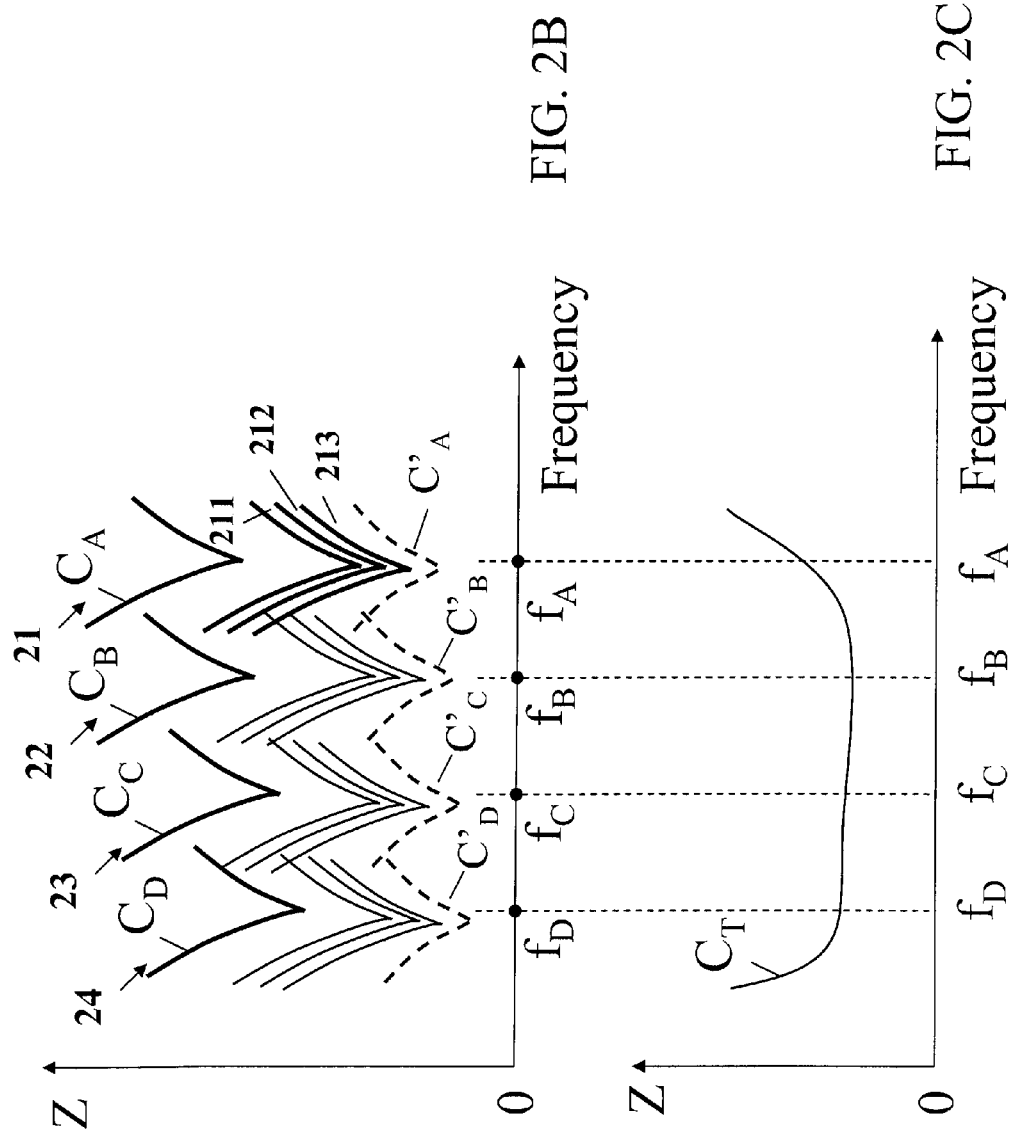

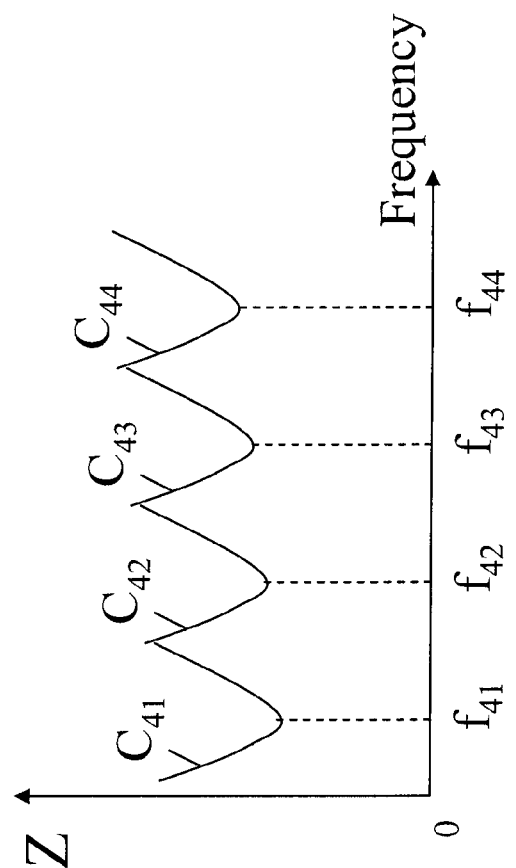
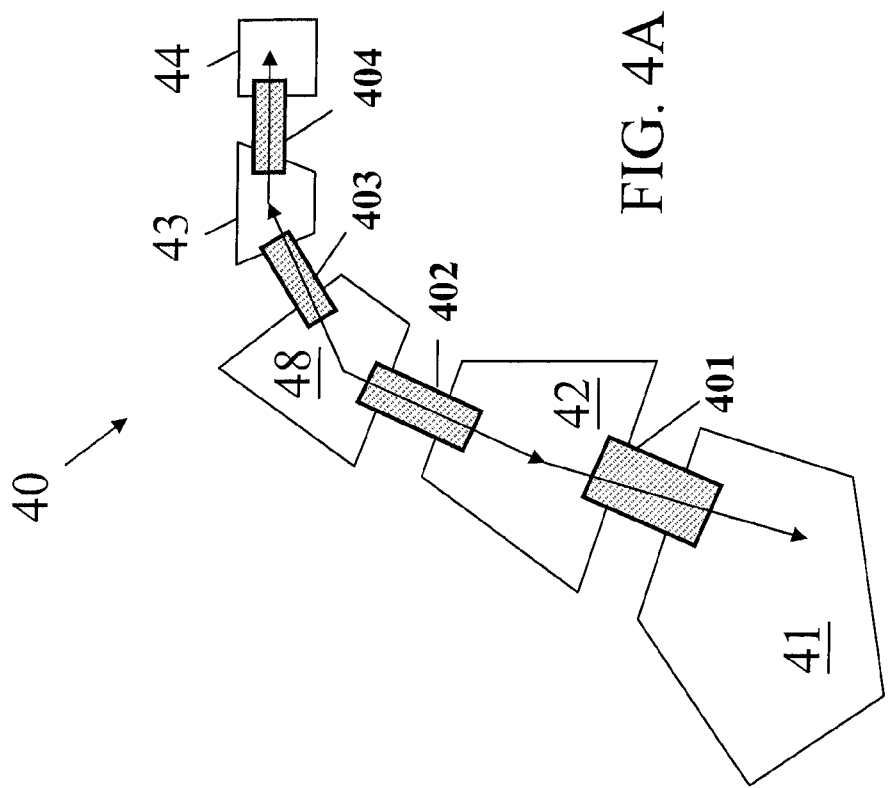
FIG. 4B
FIG. 4A

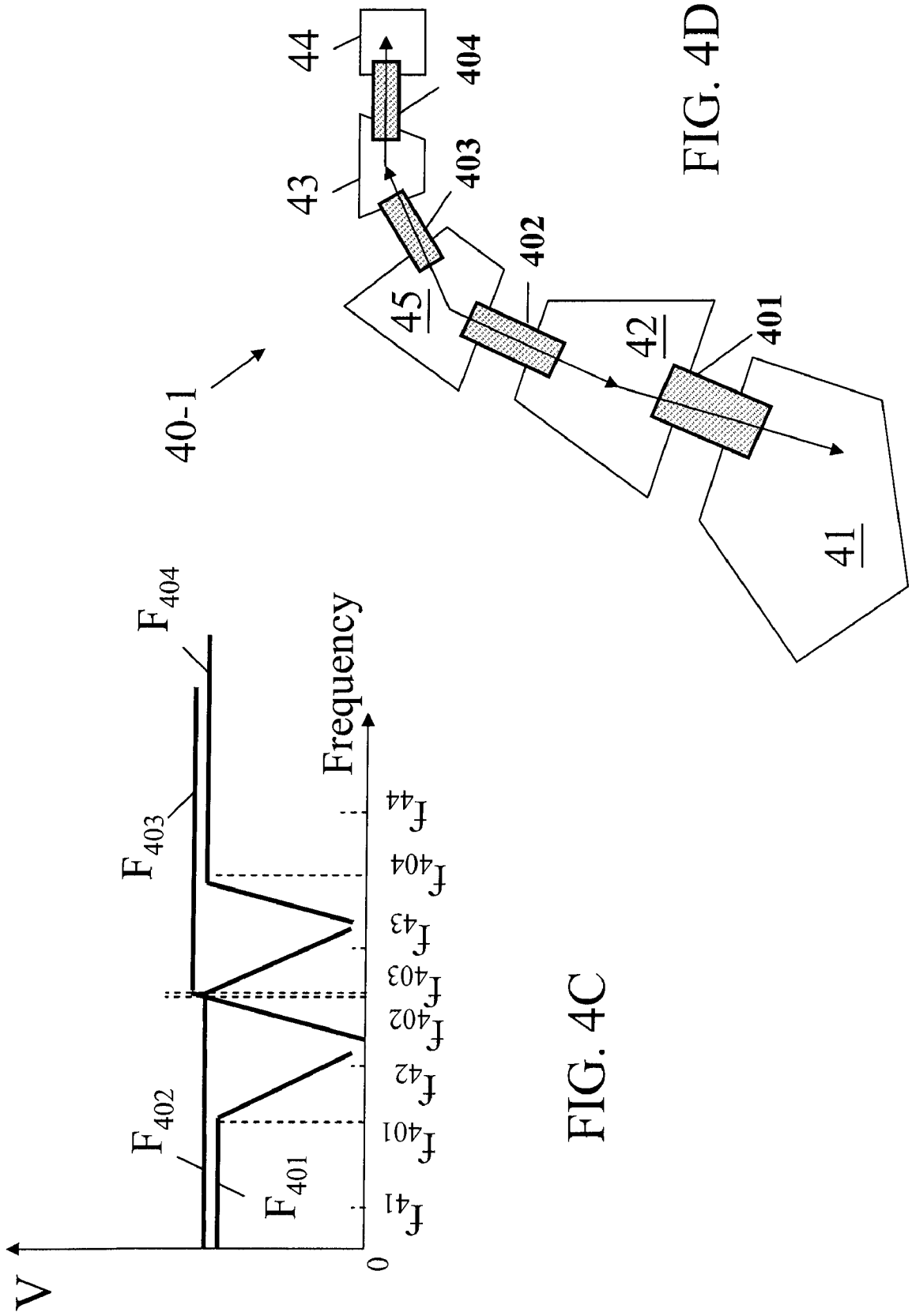

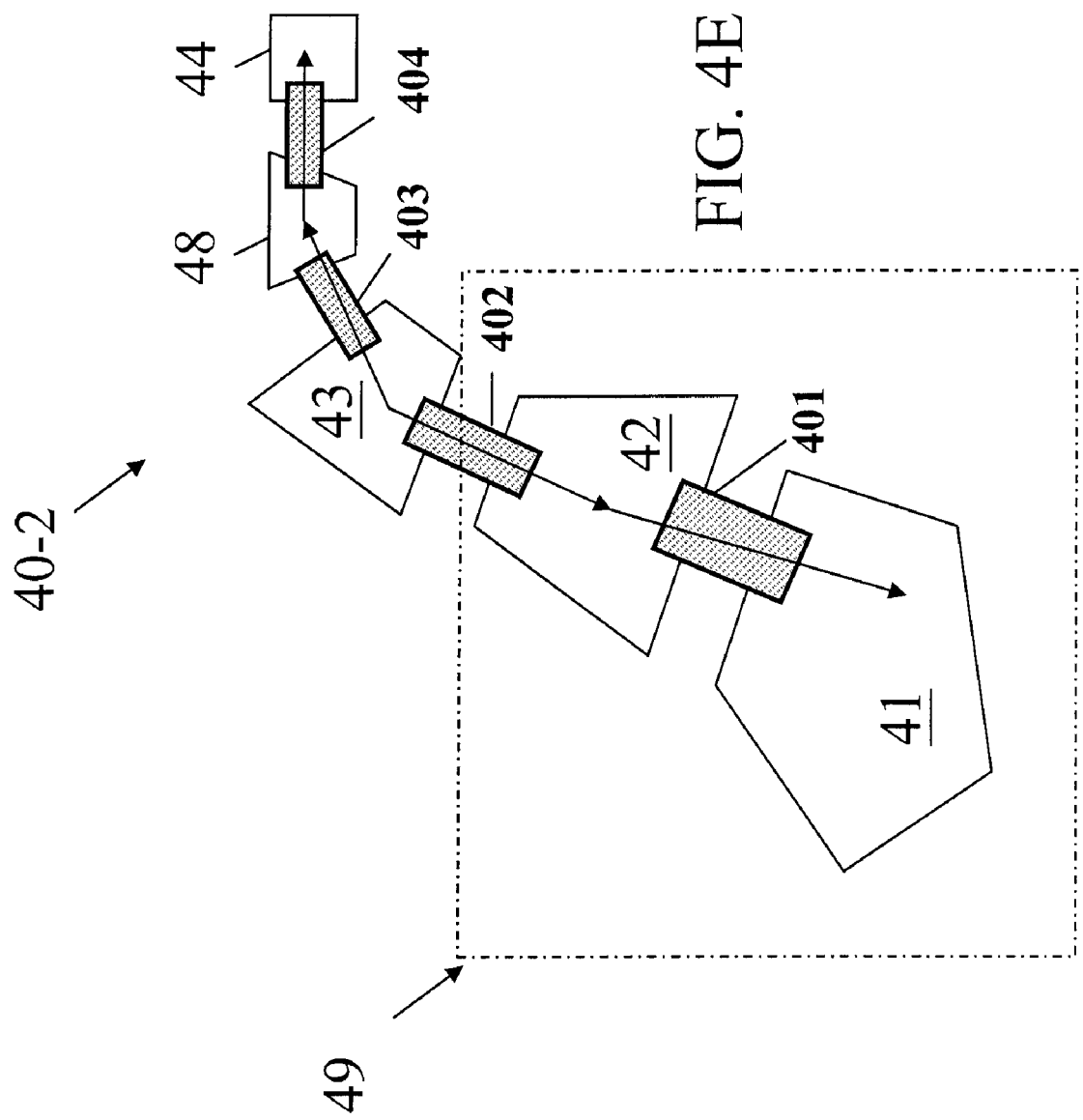

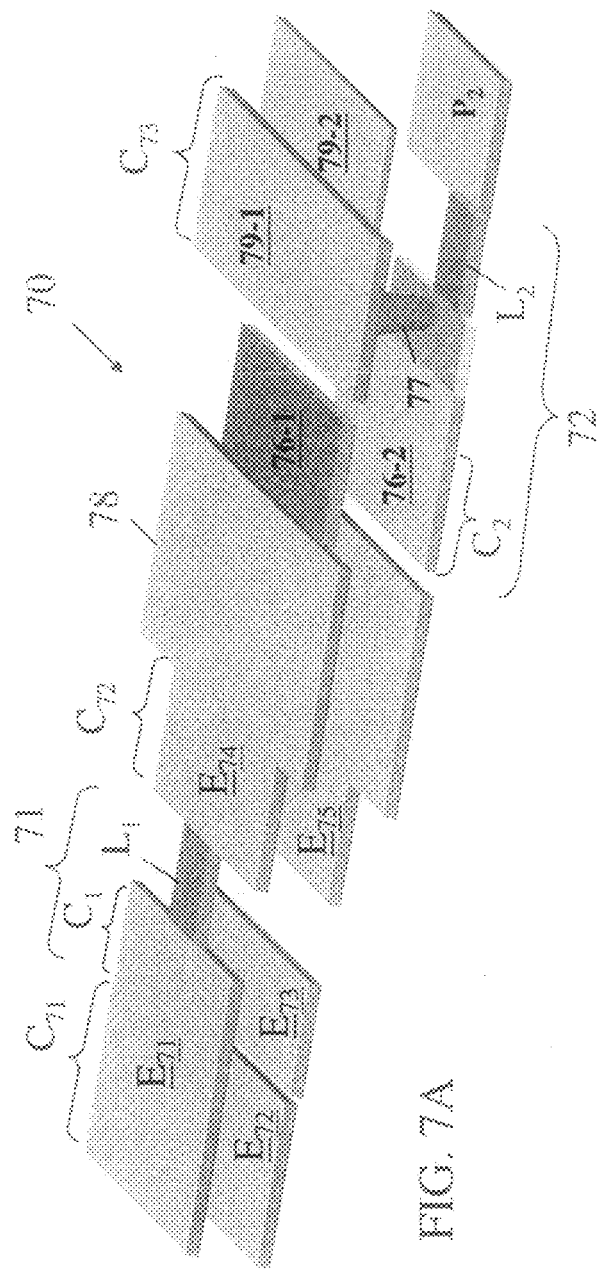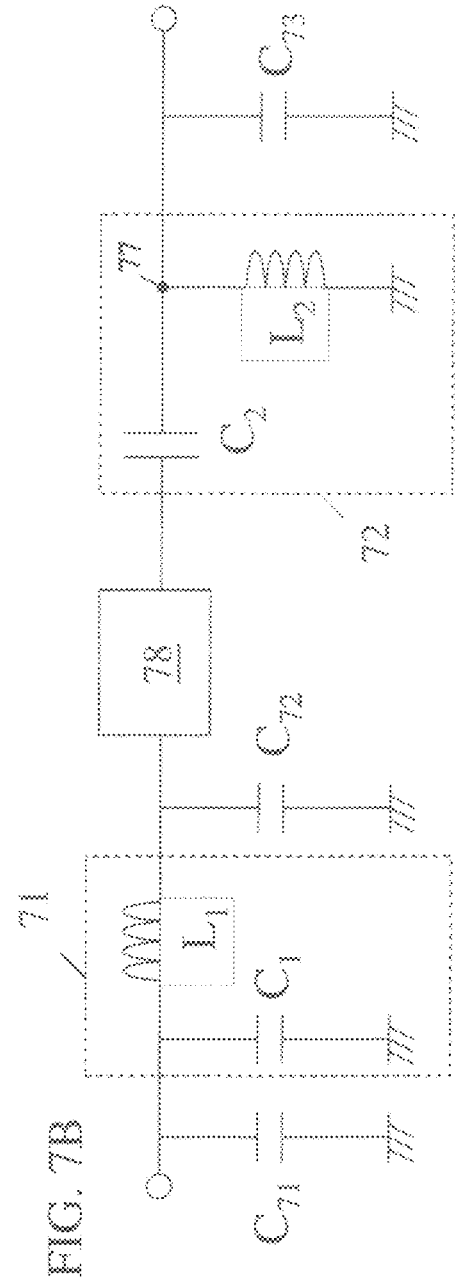
FIG. 7A
FIG. 7B

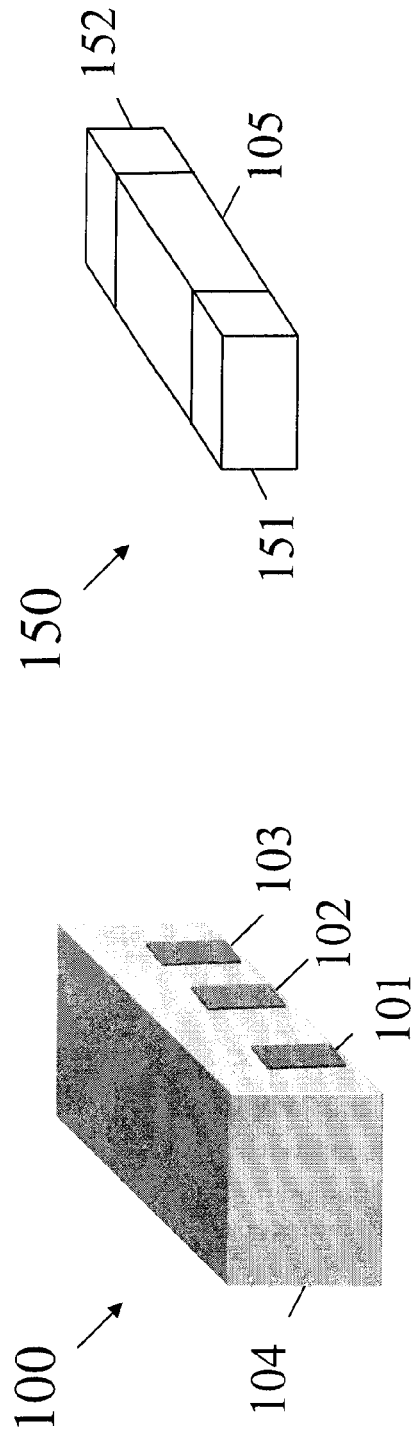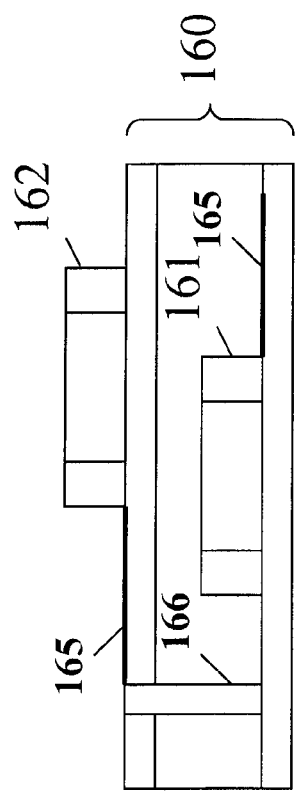
FIG. 10A
FIG. 10B
FIG. 10C

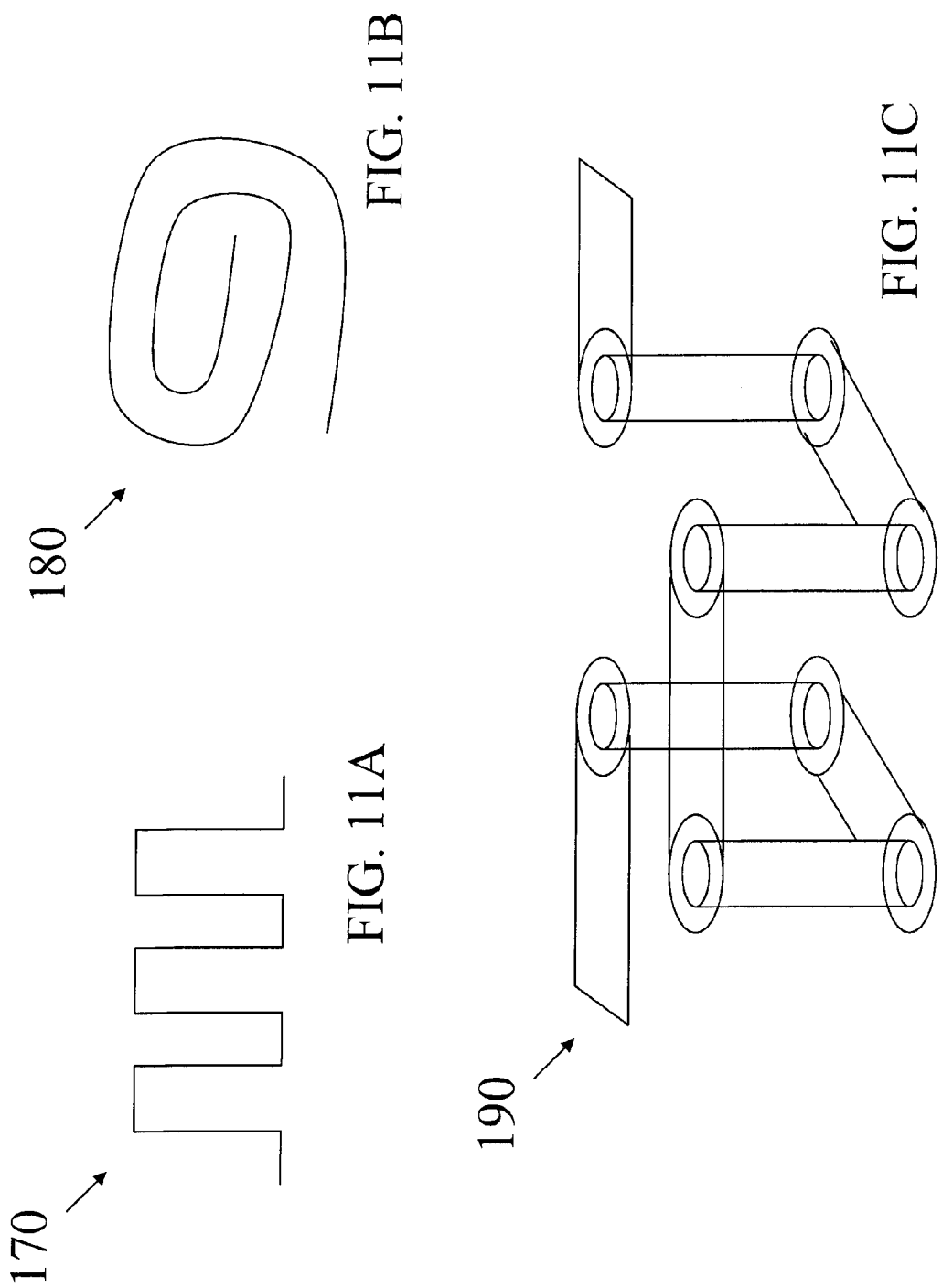

CAPACITOR DEVICES WITH A FILTER STRUCTURE

CROSS-REFERENCE TO RELATED APPLICATIONS

This application claims the benefit of priority from U.S. Provisional Application No. 61/032,777, filed Feb. 29, 2008, the contents of which are incorporated by reference in its entirety.

TECHNICAL FIELD

Embodiments disclosed herein relate to a capacitor device and, more particularly, to a capacitor device having a filter structure to respond to switching noise in time.

BACKGROUND

With the increasing interest in high-frequency and high-speed electronic systems, the rise time of a circuit system may get faster and the noise margin of the circuit system may deteriorate. Consequently, power integrity may become an issue. Skilled persons in the art will understand that it is important to maintain power integrity in a circuit system because signal integrity may not be achieved without a stable and low-noise power supply. Generally, the stability of a circuit system may largely depend on the noise immunity of the circuit. To provide a stable power supply, de-coupling capacitors may be used to suppress switching noise due to high-speed turn-on or turn-off in an integrated circuit (IC). A de-coupling capacitor may suppress glitches, attenuate noise and stabilize power supply. Furthermore, a de-coupling capacitor may be arranged near to a power or ground terminal of the IC so as to minimize parasitic inductance due to the length of a conductive path between the de-coupling capacitor and the IC. A lengthy path may adversely affect or impair the function of a de-coupling capacitor.

De-coupling capacitors may be mounted on a substrate, for example, a printed circuit board (PCB), an IC substrate, a flexible substrate or a silicon substrate, using known surface mount technology (SMT) and thus may be called "surface mount device" (SMD) capacitors. Alternatively, other types of capacitors may be mounted on or in the substrate and coupled with an IC to provide similar effects as those SMD capacitors. As the operation of ICs gets faster, the frequency of the associated noise, such as switching noise, also gets higher and more problematic, which may require more de-coupling capacitors and/or de-coupling capacitors with better characteristics. With the increasing speed of electrical circuits and the shrinking available substrate space, finding SMD capacitors that are capable of satisfying the design need becomes a challenge. Additionally, SMD capacitors mounted on a substrate requires certain substrate space and may limit the substrate space available for other devices. With the increasing terminals of IC and the densely arranged terminals, the wiring design for coupling the IC to external capacitors may also post another challenge.

Capacitors, which may refer to planar capacitors embedded or buried in a PCB, chip carrier or substrate, have been proposed to replace the SMD capacitors. As defined herein, a substrate may be comprised of an organic or inorganic material, including semiconductor, organic, ceramic, glass, flexible or metal materials. FIG. 1A is a schematic cross-sectional view of a conventional embedded capacitor device 10, and FIG. 1B is a schematic top view of the embedded capacitor device 10. Referring to FIG. 1A and also FIG. 1B, the embedded capacitor device 10 may include a first capacitor 11, a second capacitor 12 and a third capacitor 13. The first capacitor 11 may include a first electrode 111 coupled to a ground plane 14 through a first conductive via 11-1, and a second electrode 112 coupled to a power plane 15 through a second conductive via 11-2. Likewise, the second capacitor 12 may include a first electrode 121 coupled to the ground plane 14 through another first conductive via 12-1, and a second electrode 122 coupled to the power plane 15 through another second conductive via 12-2. Moreover, the third capacitor 13 may include a first electrode 131 coupled to the ground plane 14 through yet another first conductive via 13-1, and a second electrode 132 coupled to the power plane 15 through yet another second conductive via 13-2. The capacitors 11, 12 and 13 may individually serve as a de-coupling capacitor, but may not function as an intergraded unit to fast respond to switching noise, as will be explained below.

FIG. 1C is a diagram illustrating an impedance curve of the embedded capacitor device 10 illustrated in FIG. 1A. Referring to FIG. 1C, curves $C_{11}$, $C_{12}$ and $C_{13}$ may respectively represent the impedance characteristics of the first, second and third capacitors 11, 12 and 13. The first capacitor 11 may be more suitable for processing high-frequency noise than the second and the third capacitors 12 and 13. On the other hand, the third capacitor 13 may be more suitable for processing low-frequency noise than the first and the second capacitors 11 and 12. Furthermore, the first, second and third capacitors 11, 12 and 13 may each include a capacitive region and an inductive region, depending on the operating frequency. As an example, the third capacitor 13 may exhibit more inductive than capacitive behavior when operated at a frequency higher than its resonance frequency $f_R$. As a result, the impedance of the embedded capacitor device 10 may increase as the operating frequency increases, which may cause deterioration of its ability to suppressing switching noise. Moreover, referring back to FIG. 1B, high-frequency noise that may occur at, for example, the second electrode 122 of the second capacitor 12, rather than in time by the first capacitor 11, which is better suited for high-frequency processing than the second capacitor 12. Similarly, low-frequency noise that may occur at the second electrode 122 of the second capacitor 12 may not be processed in time by the third capacitor 13, which is better suited for low-frequency processing than the second capacitor 12. Consequently, the conventional embedded capacitor device 10 may not effectively respond to switching noise.

BRIEF SUMMARY

Consistent with the disclosed embodiments, there is provided a capacitor device, comprising a first capacitor and a first filter coupling the first capacitor and a conductive region, wherein the first capacitor has a first resonance frequency and the first filter is configured to operate at a first frequency band covering the first resonance frequency.

Consistent with the disclosed embodiments there is also provided a capacitor device, comprising a first filter coupling a first capacitor to a conductive region; and a second filter coupling a second capacitor to the first capacitor.

Additional features and advantages of the disclosed embodiments will be set forth in part in the description which follows, and in part will be obvious from the description, or may be learned by practice of the disclosed embodiments. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The foregoing summary, as well as the following detailed description of the disclosed embodiments, will be better understood when read in conjunction with the appended drawings. For the purpose of illustrating the disclosed embodiments, there are shown in the drawings examples which are presently preferred. It should be understood, however, that the disclosed embodiments are not limited to the precise arrangements and instrumentalities shown.

In the drawings:

FIG. 1A is a schematic cross-sectional view of a conventional embedded capacitor device;

FIG. 1B is a schematic top view of the embedded capacitor device illustrated in FIG. 1A;

FIG. 2B is a conceptual diagram illustrating an effect of replacing a large capacitor with several small capacitors coupled in parallel;

FIG. 2C is a diagram illustrating a desirable bandwidth for a decoupling capacitor device;

FIG. 4A is a schematic top view of a decoupling capacitor device consistent with another disclosed embodiment;

FIG. 4B is a diagram illustrating impedance curves of the decoupling capacitor device illustrated in FIG. 4A;

FIG. 4C is a diagram illustrating transmission curves of filters illustrated in FIG. 4A;

FIG. 4D is a schematic top view of a decoupling capacitor device consistent with yet another disclosed embodiment;

FIG. 4E is a schematic top view of a decoupling capacitor device consistent with yet another disclosed embodiment;

FIG. 7A is a schematic perspective view of a capacitor device consistent with another disclosed embodiment;

FIG. 7B is a diagram of an equivalent circuit of the capacitor device illustrated in FIG. 7A;

FIGS. 10A and 10B are diagrams of exemplary surface mount devices;

FIG. 10C is a schematic diagram of a circuit board with at least one surface mount device;

FIGS. 11A to 11C are schematic diagrams of exemplary inductors;

DETAILED DESCRIPTION OF THE DISCLOSED EMBODIMENTS

Reference will now be made in detail to the disclosed embodiments illustrated in the accompanying drawings. Wherever possible, the same reference numbers will be used throughout the drawings to refer to the same or like portions. It should be noted that the drawings are in greatly simplified form and are not to precise scale. In reference to the disclosure herein, for purposes of convenience and clarity only, directional terms, such as top and bottom, are used with respect to the accompanying drawings. Such directional terms used in conjunction with the following description of the drawings should not be construed to limit the scope of the invention in any manner not explicitly set forth in the appended claims.

Figure 2A:
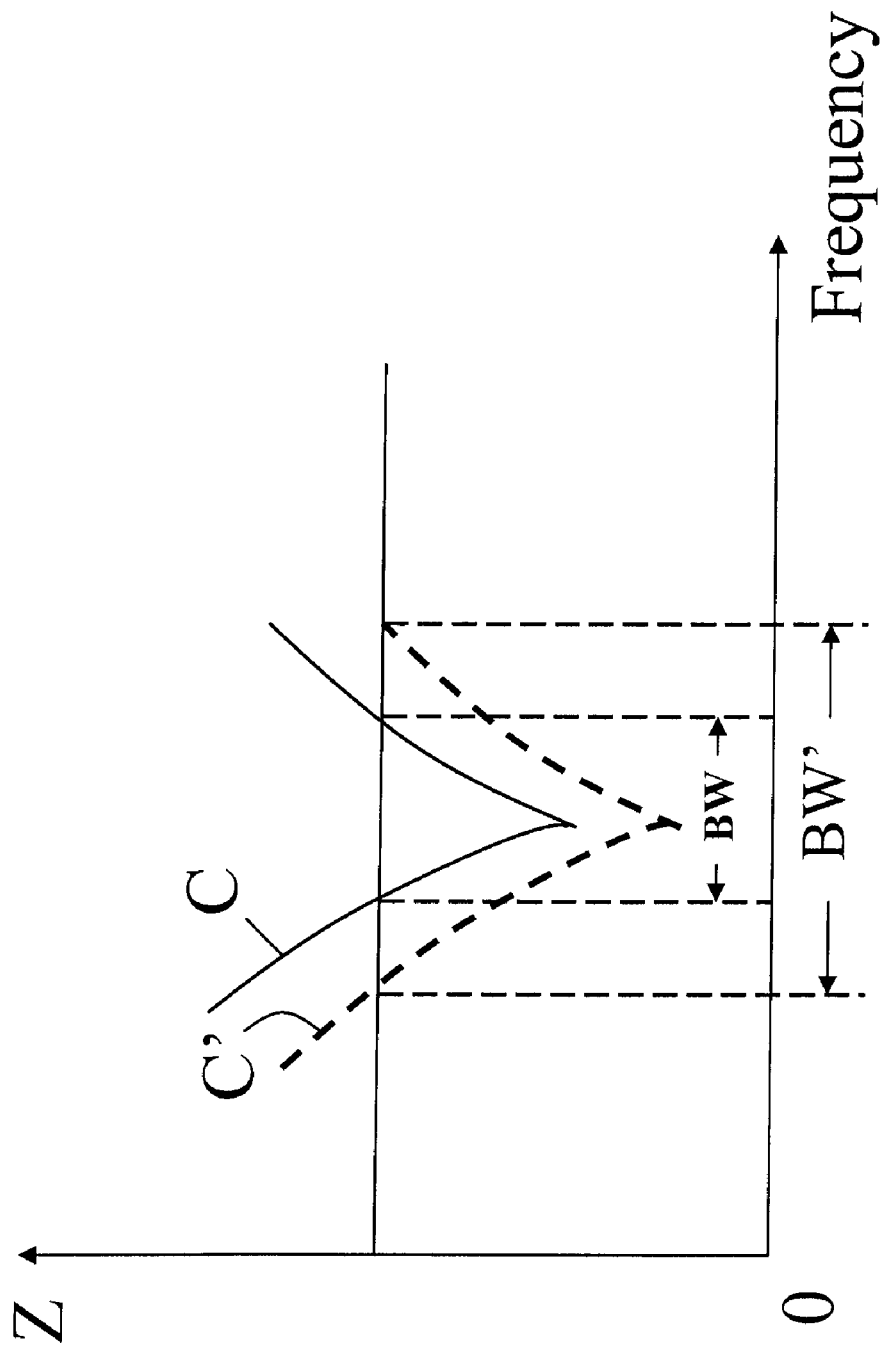
FIG. 2A is a conceptual diagram illustrating a method of increasing the bandwidth of a capacitor.

FIG. 2A is a conceptual diagram illustrating a method of increasing the bandwidth of a capacitor, which may include an embedded capacitor, buried capacitor or discrete capacitor. Referring to FIG. 2A, an impedance curve C may represent the impedance characteristics of the capacitor, which may have a bandwidth BW at a given impedance. The bandwidth BW may be expanded to BW' at the same given impedance by reducing the inductance of the capacitor. Impedance curve C' corresponds to the expanded bandwidth, BW'. In one example, the impedance of a capacitor may be reduced by dividing the capacitor into several relatively small capacitors and electrically coupling the several small capacitors in parallel.

FIG. 2B is a conceptual diagram illustrating an effect of replacing a capacitor having a large capacitance with several capacitors coupled in parallel, each of which have a small capacitance. Referring to FIG. 2B, a capacitor device may include a plurality of capacitors 21, 22, 23 and 24 having corresponding impedance curves $C_A$, $C_B$, $C_C$ and $C_D$, respectively. Each of the capacitors 21 to 24 may be reduced in inductance, and in turn impedance, by dividing each capacitor 21, 22, 23 or 24 into smaller capacitors and electrically coupling the smaller capacitors in parallel. For example, capacitor 21 may be divided into smaller capacitors 211, 212 and 213, which in turn may be electrically coupled in parallel to each other to provide a resultant impedance curve $C'_A$ with a resonance frequency $f_A$. Similarly, resultant impedance curves $C'_B$, $C'_C$ and $C'_D$ respectively with resonance frequencies $f_B$, $f_C$ and $f_D$ for the capacitors 22, 23 and 24, respectively, may be obtained. The impedances represented by the curves $C'_A$, $C'_B$, $C'_C$ and $C'_D$ are smaller than those represented by the curves $C_A$, $C_B$, $C_C$ and $C_D$. As a result, a greater bandwidth of the embedded capacitor device may be achieved. The conceptual diagram of FIG. 2B illustrates impedance curves of capacitors 21-24 obtained under ideal conditions. Although impedance curves of capacitors 21-24 obtained under normal operating conditions would look slightly different, the effect would remain the same.

FIG. 2C is a diagram illustrating a desirable bandwidth for a decoupling capacitor device. Referring to FIG. 2C, the envelope defined by the curves $C'_A$, $C'_B$, $C'_C$ and $C'_D$ may become more flat if more such capacitors 21 to 24 and small capacitors 211 to 213 are employed in the decoupling capacitor device, illustrated as exemplary resulting impedance curve $C_T$, which illustrates an impedance curve obtained under ideal conditions. Consequently, a relatively large bandwidth spanning a wide range from the low frequency $f_D$ to the high frequency $f_A$ may be obtained. A decoupling capacitor device with such a bandwidth may provide relatively low impedance and relatively high noise immunity and thus may be suitable for use in a high-frequency operating environment. In one example consistent with the disclosed embodiments, $f_A$, $f_B$, $f_C$ and $f_D$ are approximately 1 gigahertz (GHz), 800 megahertz (MHz), 500 MHz and 200 MHz, respectively. However, the values of $f_A$, $f_B$, $f_C$ and $f_D$ may vary to fit different applications. Although the example discussed above utilizes four capacitors, more or less capacitors may be used to the same effect.

Figure 3B:
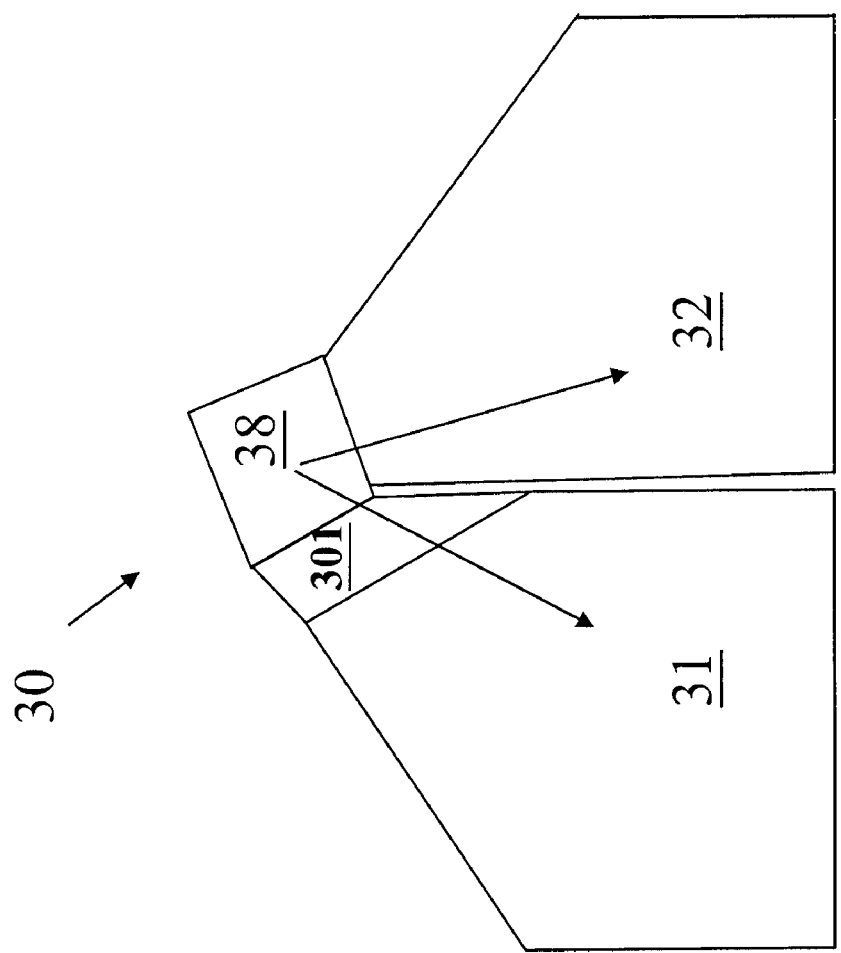
FIG. 3B is schematic top view of another decoupling capacitor device.
Figure 3A:
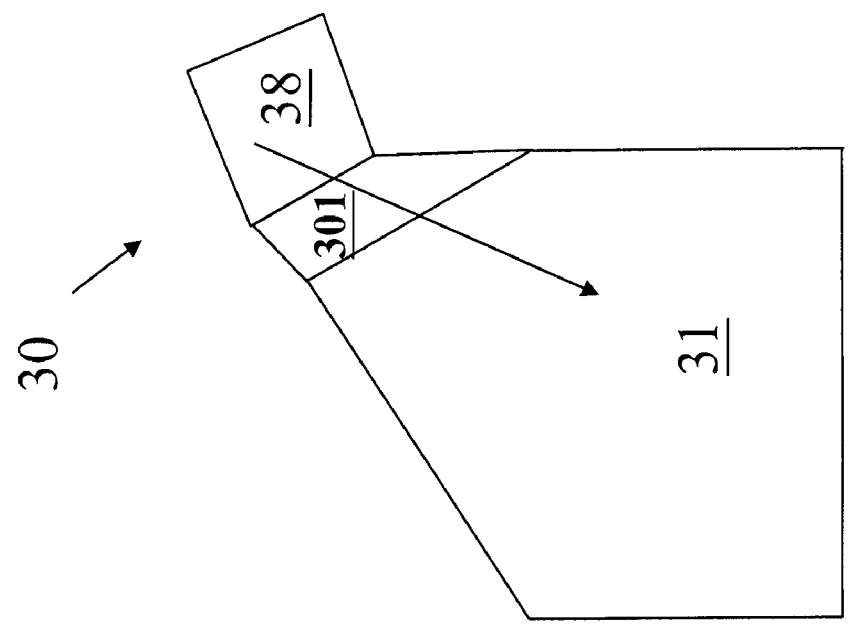
FIG. 3A is a schematic top view of a decoupling capacitor device.
Figures 3C, 3D:
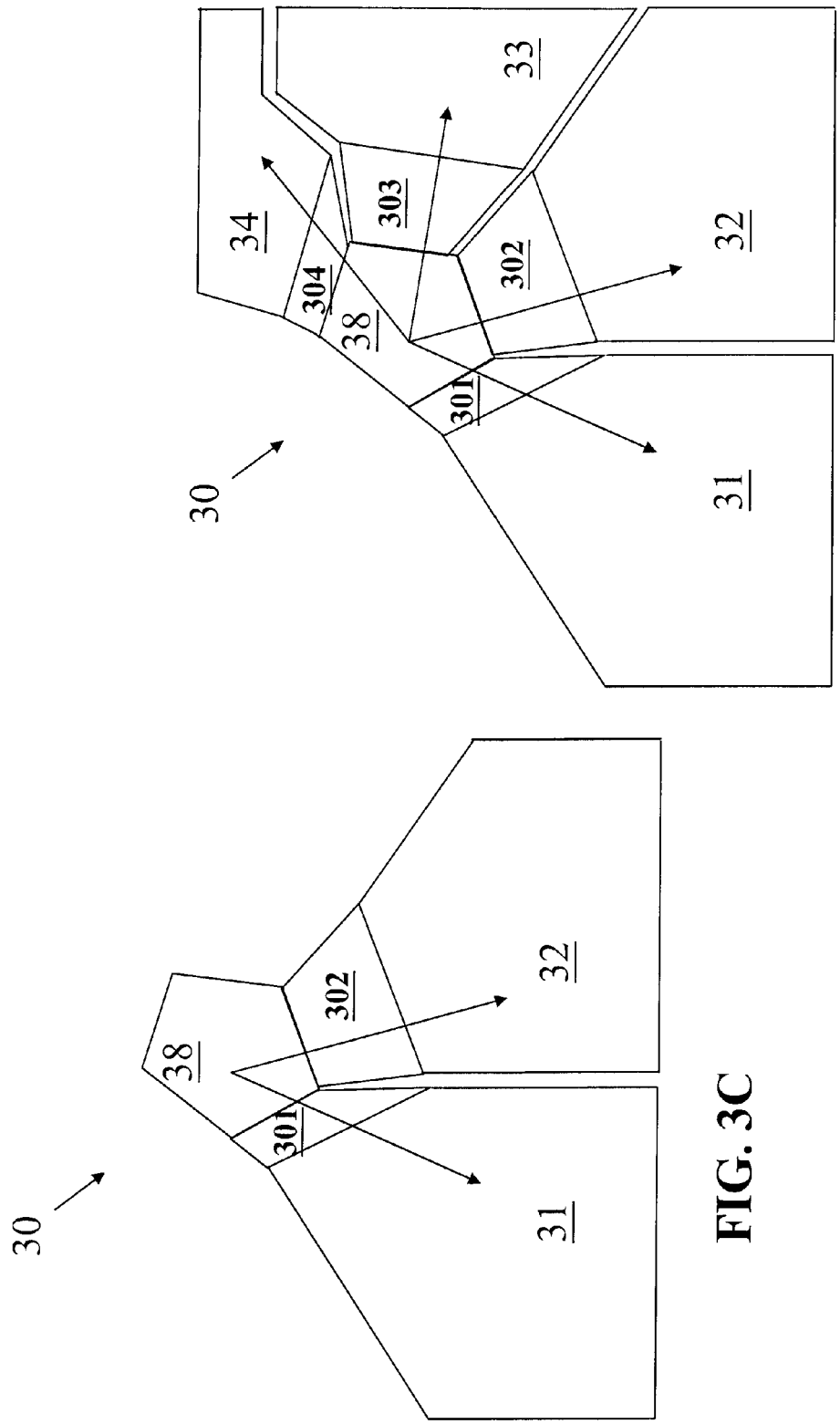
FIG. 3C is a schematic top view of yet another decoupling capacitor device.
FIG. 3D is a schematic top view of yet another decoupling capacitor device.

FIG. 3A illustrates an exemplary decoupling capacitor device 30 that may include a first capacitor 31 coupled via a first filter 301 to entry region 38. Filter 301 may operate in a manner consistent with the description thereof discussed further below. The entry region 38 may be, for example, a conductive region or common coupling area where switching noise may enter or occur. In effect, the conductive region or common coupling area, acts as a capacitor. FIG. 3B illustrates the capacitor device 30 illustrated in FIG. 3A with an additional second capacitor 32. FIG. 3C illustrates the capacitor device 30 illustrated in FIG. 3B, with an additional second filter 302 coupling second capacitor 32 to entry region 38.

FIG. 3D is a schematic top view of a decoupling capacitor device 30 consistent with another disclosed embodiment. Referring to FIG. 3D, the decoupling capacitor device 30 may include a first capacitor 31, a second capacitor 32, a third capacitor 33 and a fourth capacitor 34. Capacitors 31-34 have capacitances $C_{31}$ to $C_{34}$, respectively. Decoupling capacitor device 30 may include a first filter 301 between first capacitor 31 and an entry region 38, a second filter 302 between second capacitor 32 and entry region 38, a third filter 303 between third capacitor 33 and entry region 38, and a fourth filter 304 between fourth capacitor 34 and entry region 38. In one example, individual filters 301 to 304 may operate on different frequency bands and act as, for example, a low-frequency filter, a high-frequency filter or a bandpass filter. With the filters 301 to 304, switching noise at a certain frequency may be quickly conducted to one of the capacitors 31 to 34 capable of processing the switching noise.

Figure 3E:
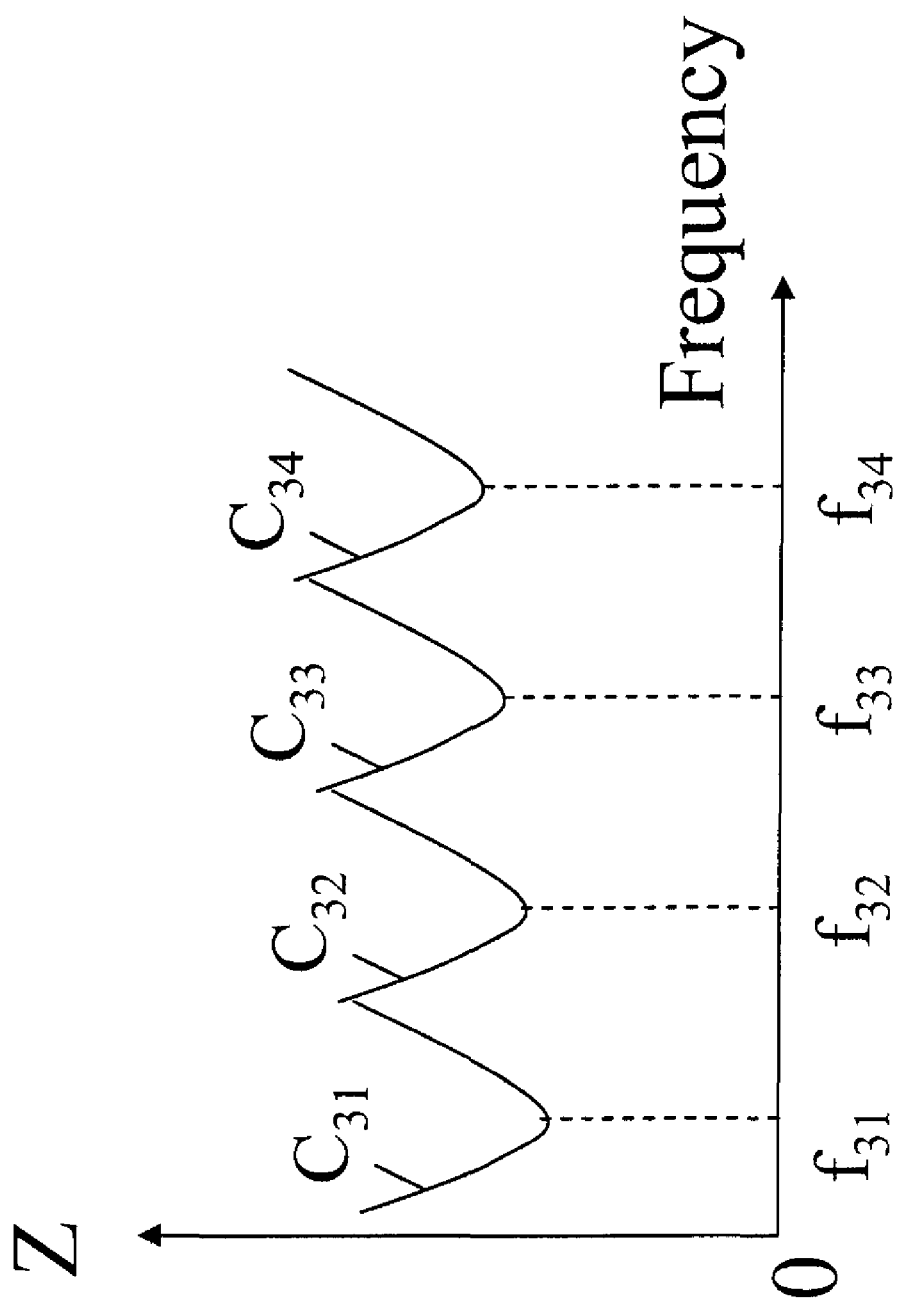
FIG. 3E is a diagram illustrating impedance curves of the decoupling capacitor device illustrated in FIG. 3D.

FIG. 3E is a diagram illustrating impedance curves of the decoupling capacitor device 30 illustrated in FIG. 3D. Referring to FIG. 3C, it may be assumed that the first capacitor 31 represented by an impedance curve $C_{31}$ has the largest capacitance due to the largest capacitive area among the capacitors 31 to 34 as shown in FIG. 3D. Furthermore, it may be assumed that the second capacitor 32 represented by an impedance curve $C_{32}$ has the second largest capacitance, the third capacitor 33 represented by an impedance curve $C_{33}$ has the second smallest capacitance and the fourth capacitor 34 represented by an impedance curve $C_{34}$ has the smallest capacitance. The resonance frequency $f_R$ of a capacitor is a function of a time constant, as can be expressed in an equation given below.

$$f_R = \frac{1}{2\pi\sqrt{LC}} \quad \text{Equation 1}$$

Since the capacitance value of $C_{31}$ > the capacitance value of $C_{32}$ > the capacitance value of $C_{33}$ > the capacitance value of $C_{34}$, Equation 1 indicates that $f_{31} < f_{32} < f_{33} < f_{34}$, wherein $f_{31}$, $f_{32}$, $f_{33}$ and $f_{34}$ are the resonance frequencies of the capacitors 31, 32, 33 and 34, respectively. Each of the capacitors 31 to 34 in one example may include an embedded capacitor having one or more capacitor sections. An example of a multi-sectional capacitor structure may be found in U.S. patent application Ser. No. 11/531,337, entitled "Embedded Capacitor Device Having a Common Coupling Area," filed Sep. 13, 2006 and assigned to the same assignee. In another example, each of the capacitors 31 to 34 may include an embedded capacitor having a multi-tier structure. An example of a multi-tier capacitor structure may be found in a Taiwanese patent application No. 096144117, entitled "Multi-Tier Capacitor Structure, Fabrication Method Thereof and Semiconductor Substrate Having the Same," filed on Nov. 21, 2007 and assigned to the same assignee, and incorporated in its entirety herein by reference.

In one example, one or more of the filters 301 to 304 may include a bandpass filter operating at a pass band. A bandpass filter may refer to a device that may pass frequencies within a certain range and attenuate frequencies outside the range. FIG. 3F is a diagram illustrating transmission curves associated with the filters 301 to 304 illustrated in FIG. 3D, consistent with a disclosed embodiment. The first filter 301 associated with a transmission curve $F_{301}$ may have a center frequency approximately equal to $f_{31}$ and cutoff frequencies at approximately $f_{300}$ and $f_{301}$. Accordingly, the first filter 301 may have a bandwidth ranging from approximately $f_{300}$ to $f_{301}$ with respect to the center frequency $f_{31}$. Likewise, the second filter 302 associated with a transmission curve $F_{302}$ may have a center frequency approximately equal to $f_{32}$ and cutoff frequencies at approximately $f_{301}$ and $f_{302}$. Accordingly, the second filter 302 may have a bandwidth ranging from approximately $f_{301}$ to $f_{302}$ with respect to the center frequency $f_{32}$. Likewise, the third filter 303 associated with a transmission curve $F_{303}$ may have a center frequency approximately equal to $f_{33}$ and cutoff frequencies at approximately $f_{302}$ and $f_{303}$. Accordingly, the third filter 303 may have a bandwidth ranging from approximately $f_{302}$ to $f_{303}$ with respect to the center frequency $f_{33}$. Moreover, the fourth filter 304 associated with a transmission curve $F_{304}$ may have a center frequency approximately equal to $f_{34}$ and cutoff frequencies at approximately $f_{303}$ and $f_{304}$. Accordingly, the fourth filter 304 may have a bandwidth ranging from approximately $f_{303}$ to $f_{304}$ with respect to the center frequency $f_{34}$.

In operation, switching noise that occurs at the entry region 38 may be conducted by the first filter 301 if the frequency of the switching noise falls within the frequency band approximately between $f_{300}$ to $f_{301}$. Similarly, switching noise that occurs at the entry region 38 may be conducted by the second filter 302, third filter 303 and fourth filter 304 if the frequency of the switching noise falls within the frequency bands approximately between $f_{301}$ to $f_{302}$, approximately between $f_{302}$ to $f_{303}$, and approximately between $f_{303}$ to $f_{304}$, respectively. Although the frequency bands are described as being approximately between respective low and high frequencies, consistent with the disclosed embodiments, the frequency bands may extend to frequencies lower than the low frequency of the frequency band, and to frequencies higher than the high frequency of the frequency band.

Figure 3G:
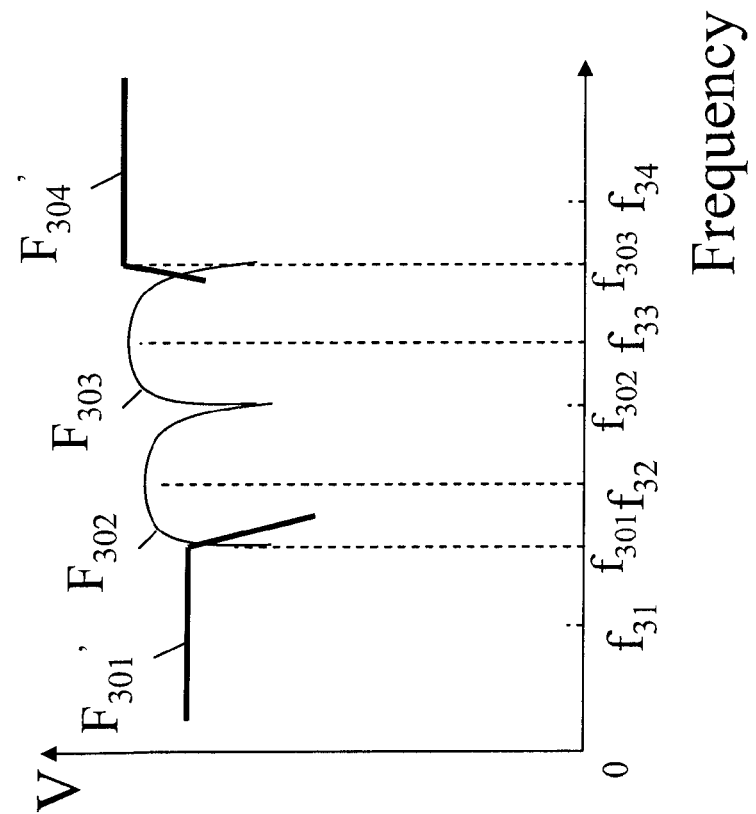
FIG. 3G is a diagram illustrating transmission curves of filters illustrated in FIG. 3D.
Figure 3F:
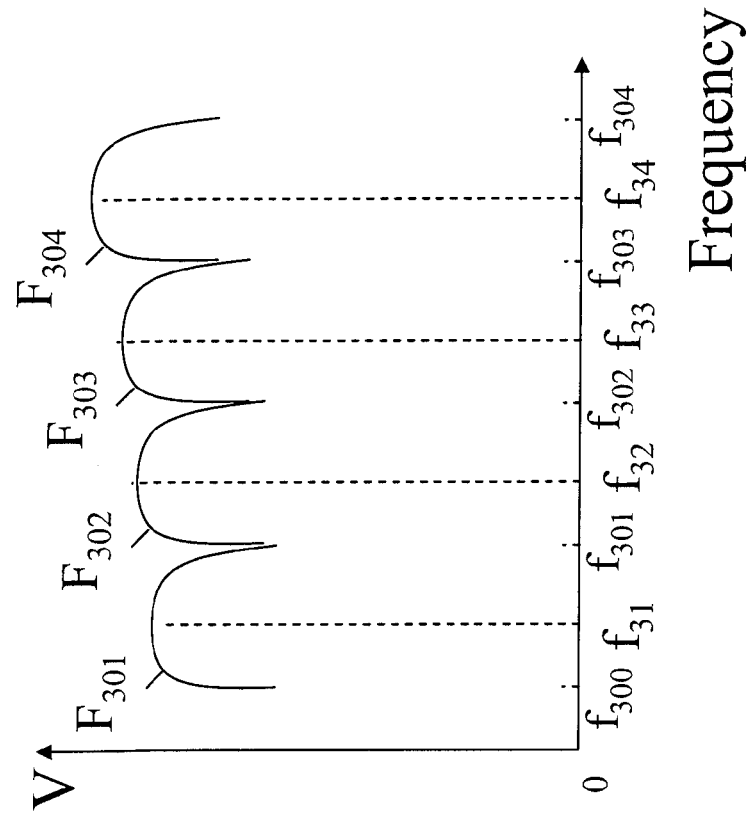
FIG. 3F is a diagram illustrating transmission curves of filters illustrated in FIG. 3D.

FIG. 3G is a diagram illustrating transmission curves of the filters 301 to 304 illustrated in FIG. 3D consistent with another disclosed embodiment. Referring to FIG. 3G, the transmission curves may be similar to the transmission curves described and illustrated with reference to FIG. 3F except, for example, curves $F_{301}'$ and $F_{304}'$. Specifically, the first filter 301 represented by the transmission curve $F_{301}'$ may include a low-pass filter with a cutoff frequency at approximately $f_{301}$. A low-pass filter may refer to a device that may pass low-frequency signals and attenuate signals with frequencies higher than its cutoff frequency. Furthermore, the fourth filter 304 represented by the transmission curve $F_{304}'$ may include a high-pass filter with a cutoff frequency at approximately $f_{303}$. A high-pass filter may refer to a device that may pass high-frequency signals and attenuate signals with frequencies lower than its cutoff frequency.

FIG. 4A is a schematic top view of a decoupling capacitor device 40 consistent with another disclosed embodiment. Referring to FIG. 4A, the decoupling capacitor device 40 may include a first capacitor 41, a second capacitor 42, a third capacitor 43 and a fourth capacitor 44. Furthermore, the decoupling capacitor device 40 may include a first filter 401 between the first capacitor 41 and the second capacitor 42, a second filter 402 between the second capacitor 42 and an entry region 48, a third filter 403 between the third capacitor 43 and the entry region 48, and a fourth filter 404 between the third capacitor 43 and the fourth capacitor 44. Entry region 48 may be, for example, a conductive region or common coupling area, and which, in effect, may act as a capacitor. In one example, the filters 401 to 404 may operate at different frequency bands. With the filters 401 to 404, switching noise may be quickly conducted to one of the capacitors 41 to 44 capable of processing the switching noise. Although FIG. 4A illustrates an embodiment which utilizes a filter on each side of a capacitor, more or less filters may be used, and in different arrangements, consistent with the disclosed embodiments.

FIG. 4B is a diagram illustrating impedance curves of the decoupling capacitor device 40 illustrated in FIG. 4A. Referring to FIG. 4B, assuming that the capacitance value of $C_{41}>$ the capacitance value of $C_{42}>$ the capacitance value of $C_{43}>$ the capacitance value of $C_{44}$, then $f_{41}<f_{42}<f_{43}<f_{44}$, wherein $C_{41}$, $C_{42}$, $C_{43}$ and $C_{44}$ are respectively the capacitance values of the capacitors 41, 42, 43 and 44, and $f_{41}$, $f_{42}$, $f_{43}$ and $f_{44}$ are respectively the resonance frequencies of the capacitors 41, 42, 43 and 44.

FIG. 4C is a diagram illustrating transmission curves $F_{401}$-$F_{404}$, associated with filters 401 to 404, respectively, illustrated in FIG. 4A. In one example, the filters 401 and 402 may each include a low-pass filter. First filter 401, associated with transmission curve $F_{401}$, may have a first cutoff frequency $f_{401}$ which may be between resonance frequencies $f_{41}$ and $f_{42}$, or may be above or below either of resonance frequencies $f_{41}$ and $f_{42}$. Furthermore, second filter 402, associated with transmission curve $F_{402}$, may have a second cutoff frequency $f_{402}$ which may be between resonance frequencies $f_{42}$ and $f_{43}$, or may be above or below either of resonance frequencies $f_{42}$ and $f_{43}$. As a result, switching noise having a frequency lower than second cutoff frequency $f_{402}$ may be conducted from entry region 48 to second capacitor 42 through second filter 402. Moreover, if the switching noise having a frequency lower than first cutoff frequency $f_{401}$, the switching noise may be further conducted from second capacitor 42 to first capacitor 41 through first filter 401.

Furthermore, in the present example, filters 403 and 404 may each include a high-pass filter. Third filter 403, associated with transmission curve $F_{403}$, may have a third cutoff frequency which may be equal to $f_{403}$, wherein third cutoff frequency $f_{403}$ may be between the resonance frequencies $f_{42}$ and $f_{43}$. Furthermore, fourth filter 404, associated with transmission curve $F_{404}$, may have a cutoff frequency $f_{404}$, wherein cutoff frequency $f_{404}$ may be between the resonance frequencies $f_{43}$ and $f_{44}$. As a result, switching noise having a frequency higher than third cutoff frequency $f_{402}$ may be conducted from entry region 48 to third capacitor 43 through third filter 403. Moreover, if the switching noise has a frequency higher than fourth cutoff frequency $f_{403}$, the switching noise may be further conducted from third capacitor 43 to fourth capacitor 44 through fourth filter 404.

FIG. 4D is a schematic top view of a decoupling capacitor device 40-1 consistent with yet another disclosed embodiment. Referring to FIG. 4D, the decoupling capacitor device 40-1 is similar to the decoupling capacitor device 40 described and illustrated in FIG. 4A except that, for example, a fifth capacitor 45 replaces the entry region 48. In operation, fifth capacitor 45 may be directly used as a decoupling capacitor.

FIG. 4E is a schematic top view of another exemplary combination of capacitors and filters consistent with the disclosed embodiments. In FIG. 4E, a decoupling capacitor device 40-2 includes entry region 48, capacitors 41-44 and filters 401-404. In addition, capacitors 41 and 42 form a pair of coupled capacitors 49. As shown in FIG. 4E, coupled capacitors 49 are coupled in series by filter 401. Additional capacitors and filters may be provided to form any desired number of serially connected capacitors and appropriate filters, consistent with the pair of capacitors illustrated as coupled capacitors 49.

Figure 5A:
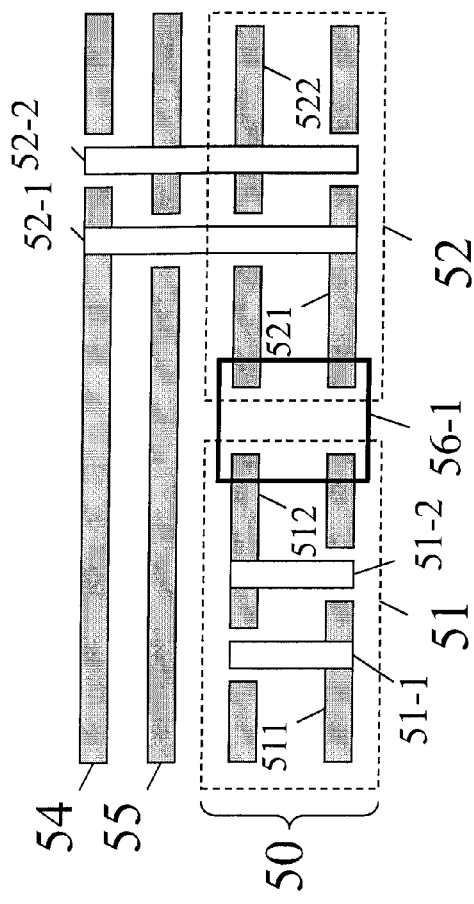
FIG. 5A is a schematic cross-sectional view of an embedded capacitor device consistent with another disclosed embodiment.

FIG. 5A is a schematic cross-sectional view of an embedded capacitor device 50 consistent with another disclosed embodiment. Referring to FIG. 5A, the embedded capacitor device 50 may include a first capacitor 51, a second capacitor 52 and a first filter 56-1 between the first capacitor 51 and the second capacitor 52. The first capacitor 51 may include a first electrode 511 coupled with a first conductive via 51-1, and a second electrode 512 coupled with a second conductive via 51-2. Furthermore, the second capacitor 52 may include a first electrode 521 coupled to a ground plane 54 through a first conductive via 52-1, and a second electrode 522 coupled to a power plane 55 through a second conductive via 52-2. First filter 56-1 couples first capacitor 51 to second capacitor 52 such that first conductive via 51-1 is coupled to ground plane 54 through first conductive via 52-1 and second conductive via 51-2 is coupled to power plane 55 through second conductive via 52-2. The first filter 56-1 may include one of a low-pass, high-pass and bandpass filter.

Figure 5B:
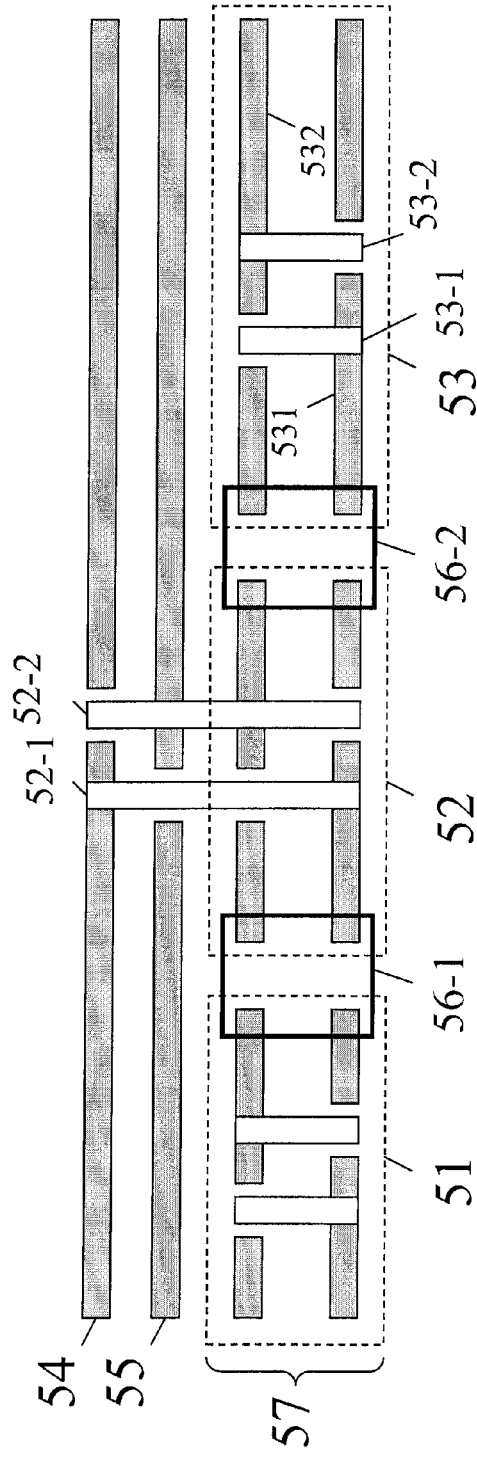
FIG. 5B is a schematic cross-sectional view of an embedded capacitor device consistent with another disclosed embodiment.

FIG. 5B is a schematic cross-sectional view of an embedded capacitor device 57 consistent with another disclosed embodiment. Referring to FIG. 5B, the embedded capacitor device 57 may be similar to the embedded capacitor device 50 described and illustrated with reference to FIG. 5A except that, for example, a third capacitor 53 and a second filter 56-2 may be added. The third capacitor 53 may include a first electrode 531 and a second electrode 532. The first electrode 531 may be coupled with the ground plane 54 through a first conductive via 53-1, the second filter 56-2 and the first conductive via 52-1. That is, third capacitor 53 is coupled to ground plane 54 and power plane 55 through second filter 56-2. The second electrode 532 may be coupled with the power plane 55 through a second conductive via 53-2, the second filter 56-2 and the second conductive via 52-2. Second filter 56-2 couples third capacitor 53 to second capacitor 52 such that first conductive via 53-1 is coupled to ground plane 54 through first conductive via 52-1 and second conductive via 53-2 is coupled to power plane 55 through second conductive via 52-2. The second filter 56-2 may include one of a low-pass, high-pass and bandpass filter.

Figure 5C:
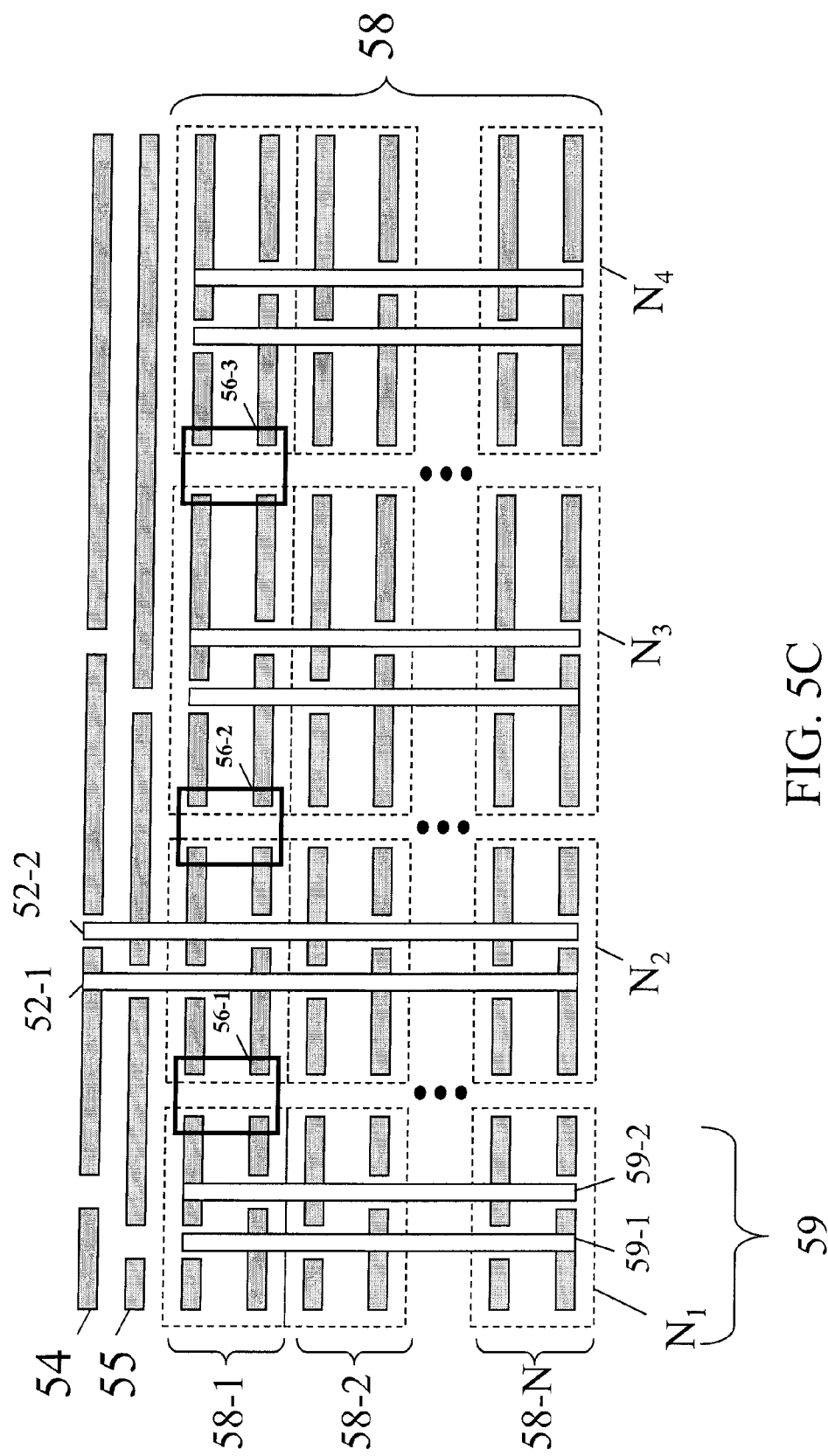
FIG. 5C is a schematic cross-sectional view of an embedded capacitor device consistent with still another disclosed embodiment.

FIG. 5C is a schematic cross-sectional view of an embedded capacitor device 58 consistent with still another disclosed embodiment. Referring to FIG. 5C, the embedded capacitor device 58 may include a number of capacitor devices 58-1 to 58-N in a stack structure, N being a natural number. Each of the capacitor devices 58-1 to 58-N may include one or more sub-capacitors. Taking the capacitor device 58-N as an example, the capacitor device 58-N may include sub-capacitors $N_1$, $N_2$, $N_3$ and $N_4$. One of the capacitor devices 58-1 to 58-N, in the present embodiment, capacitor device 58-1, may further include one or more filters 56-1, 56-2 and 56-3, which in turn may electrically couple the one or more sub-capacitors of the stacked capacitor devices 58-1 to 58-N. Furthermore, a pair of conductive vias may couple a sub-capacitor in each of the capacitor devices 58-1 to 58-N to the ground plane 54 and the power plane 55 through, for example, the conductive vias 52-1 and 52-2. As shown in FIG. 5C, a pair of conductive vias 59-1 and 59-2 may couple a leftmost sub-capacitor, illustrated as sub-capacitor 59, in each of the capacitors 58-1 to 58-N through the first filter 56-1 and the conductive vias 52-1 and 52-2 to the ground plane 54 and the power plane 55. The multi-stack capacitor structure may facilitate reducing the impedance of the embedded capacitor device 58. Furthermore, the filters 56-1 to 56-3 may facilitate conducting switching noise in time.

Figures 6A, 6B:
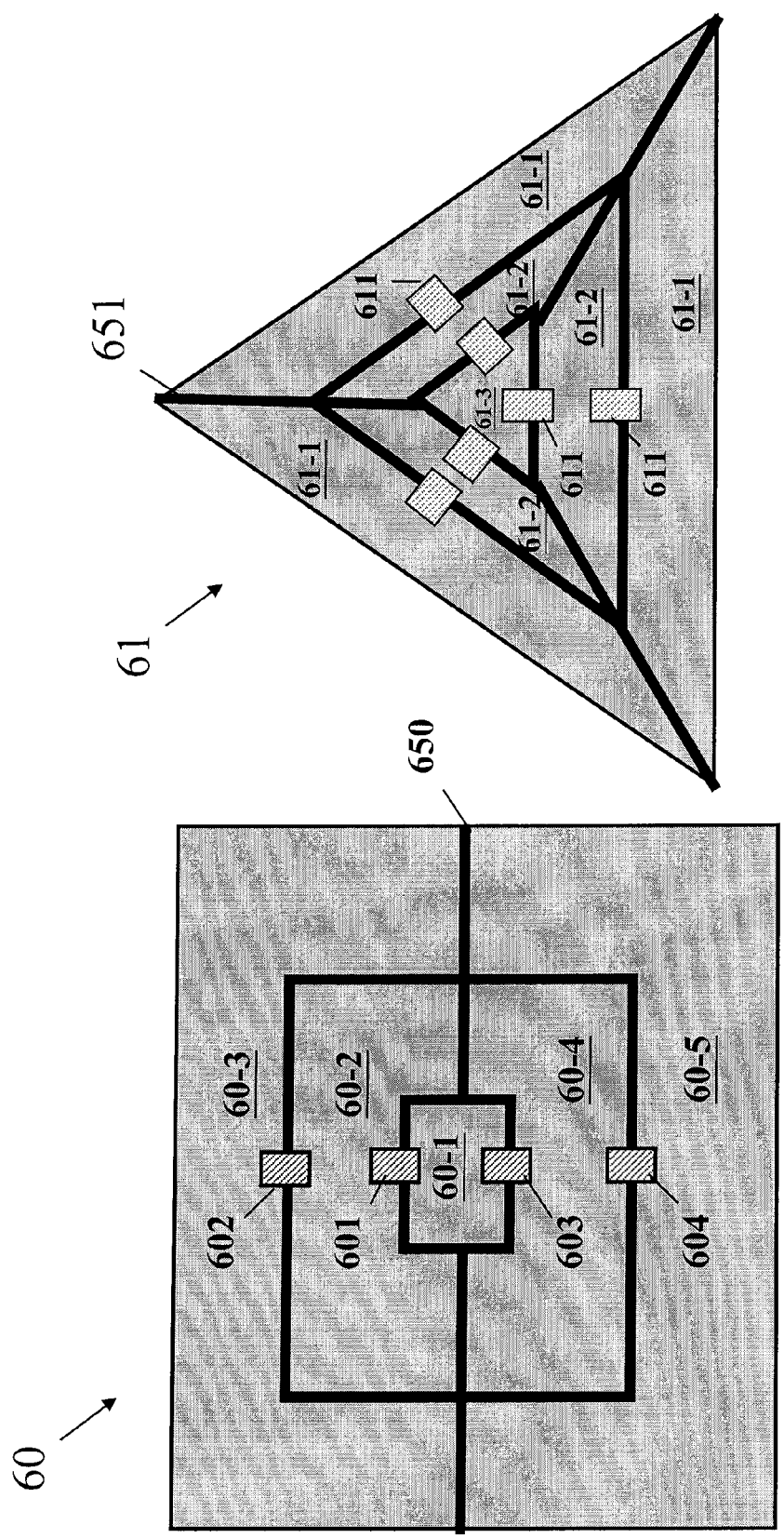
FIG. 6A is a schematic top planar view of a capacitor device consistent with another disclosed embodiment.
FIG. 6B is a schematic top planar view of a capacitor device consistent with another disclosed embodiment.

FIG. 6A is a schematic top planar view of an embedded capacitor device 60 consistent with another disclosed embodiment. Referring to FIG. 6A, the embedded capacitor device 60 may include capacitor sections 60-1 to 60-5 and filters 601 to 604. The capacitor sections 60-1 to 60-5 may be divided from a capacitive area of the embedded capacitor device 60 and electrically coupled by the filters 601 to 604. Specifically, each of the filters 601 to 604 may include one of a high-pass, low-pass and bandpass filter, and may function in a similar manner to the filters 401 to 404 described and illustrated with reference to FIG. 4D. In one example, one of the capacitor sections 60-1 to 60-5 may be replaced by a conductive region such as the entry region 48 described and illustrated with reference to FIG. 4A.

FIG. 6B is a schematic top planar view of an embedded capacitor device 61 consistent with another example of the disclosed embodiments. Referring to FIG. 6B, the embedded capacitor device 61 may include capacitor sections 61-1 to 61-3 and filters 611. The capacitor sections 61-1 to 61-3, may be divided from a capacitive area of the embedded capacitor device 61 and electrically coupled by the filters 611. Each of the filters 611 may include one of a high-pass, low-pass and bandpass filter, and may function in a similar manner to the filters 401 to 404 described and illustrated with reference to FIG. 4D. In one example, one of the capacitor sections 61-1 to 61-3 may be replaced by a conductive region such as the entry region 48 described and illustrated with reference to FIG. 4A.

FIG. 7A is a schematic perspective view of an embedded capacitor device 70, which uses LC filters. FIG. 7B is a diagram of an equivalent circuit of the embedded capacitor device 70 illustrated in FIG. 7A. Referring to FIG. 7A and also FIG. 7B, the embedded capacitor device 70 may include capacitors $C_{71}$, $C_{72}$ and $C_{73}$, and filters 71 and 72. The filter 71 may be electrically coupled between the capacitors $C_{71}$ and $C_{72}$, and may serve as a low-pass filter. The capacitor $C_{71}$ may be defined between electrodes $E_{71}$ and $E_{72}$, and the capacitor $C_{72}$ may be defined between electrodes $E_{74}$ and $E_{75}$. Furthermore, the filter 71 may include a first capacitor $C_1$ and a first inductor $L_1$. The first capacitor $C_1$ may be defined between electrodes $E_{71}$ and $E_{73}$, and the first inductor $L_1$ may take the form of a contiguous strip formed between the electrodes $E_{71}$ and $E_{74}$.

Moreover, filter 72 may be electrically coupled between an entry region 78 and the capacitor $C_{73}$, and may serve as a high-pass filter. The capacitor $C_{73}$ may be defined between electrodes 79-1 and 79-2. Furthermore, the filter 72 may include a second capacitor $C_2$ and a second inductor $L_2$. The second capacitor $C_2$ may be defined between a first electrode 76-1 and a second electrode 76-2. The first electrode 76-1 may be contiguous with the entry region 78. The second inductor $L_2$ may take the form of a strip contiguous between the second electrode 76-2 of the second capacitor $C_2$ and a terminal $P_2$. The terminal $P_2$ may be coupled with a ground plane (not shown), in a manner consistent with the disclosed embodiments. Furthermore, the second electrode 76-2 of the second capacitor $C_2$ and the electrode 79-1 of the capacitor $C_{73}$ may be electrically coupled to each other through a conductive via 77.

Figure 8B:
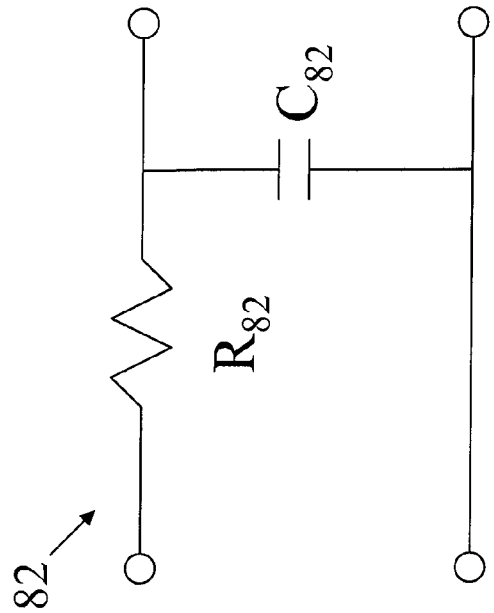
FIGS. 8A and 8B are diagrams of exemplary resistor-capacitor filters.
Figure 8A:
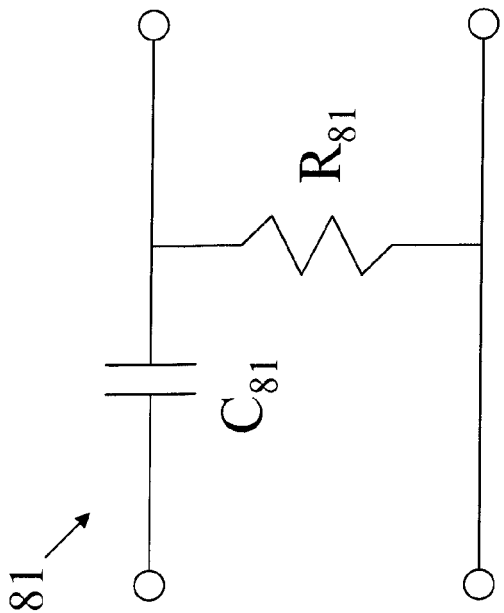

FIGS. 8A and 8B are diagrams of resistor-capacitor (RC) filters 81 and 82 consistent with the disclosed embodiments. Referring to FIG. 8A, the RC filter 81 may include a first resistor $R_{81}$ and a first capacitor $C_{81}$ coupled in parallel with each other, and may serve as a high-pass filter. Referring to FIG. 8B, similarly, the RC filter 82 may include a second capacitor $C_{82}$ and a second resistor $R_{82}$ coupled in parallel with each other, and may serve as a low-pass filter. In one example, the RC filter 81 may replace the LC filter 72 described and illustrated with reference to FIGS. 7A and 7B. In another example, the RC filter 82 may replace the LC filter 71 described and illustrated with reference to FIGS. 7A and 7B.

Figure 8C:
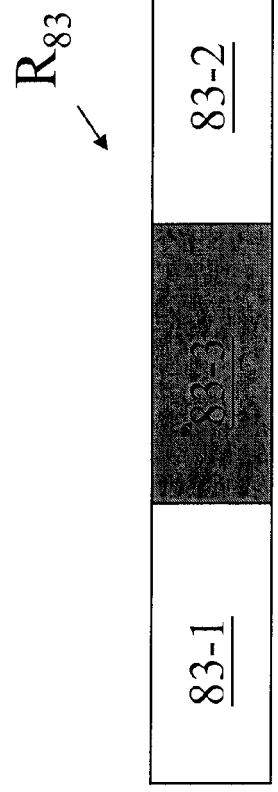
FIG. 8C is a diagram of an exemplary resistor device in a substrate.

FIG. 8C is a diagram of a resistor device $R_{83}$. Referring to FIG. 8C, the resistor device $R_{83}$ may include a first contact 83-1, a second contact 83-2 and a resistive material 83-3 between the contacts 83-1 and 83-2 to provide electrical resistance. Resistor device 83 may be used in RC filter 81 or RC filter 82 illustrated in FIGS. 8A and 8B, and also may be embedded or buried within a substrate, or formed on a surface of the substrate. in accordance with the disclosed embodiments.

Figure 9C:
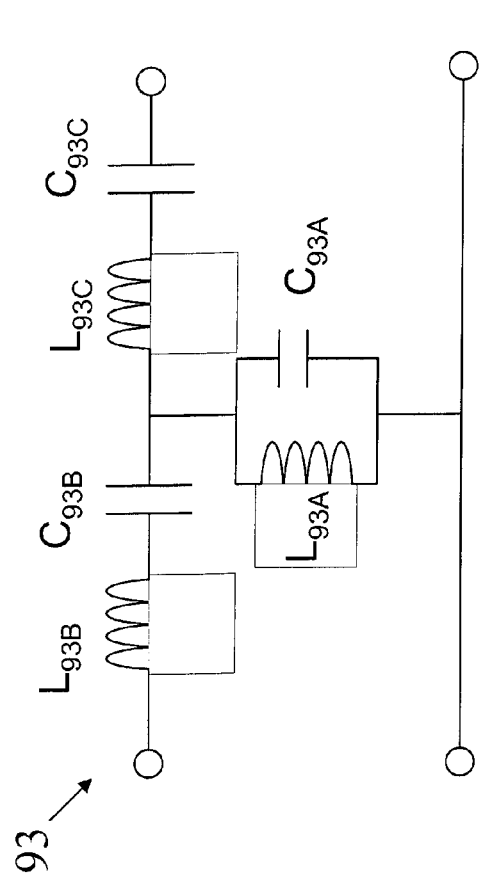
FIGS. 9A to 9D are diagrams of exemplary filters.
Figure 9D:
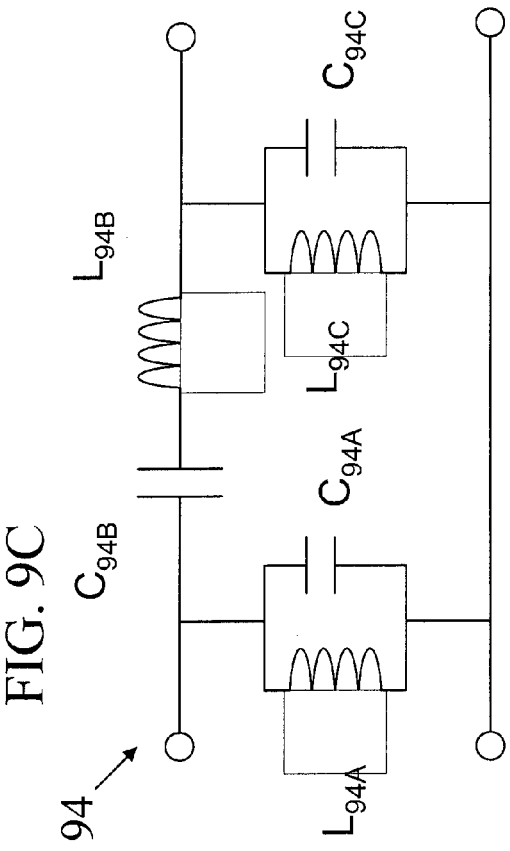
Figure 9A:
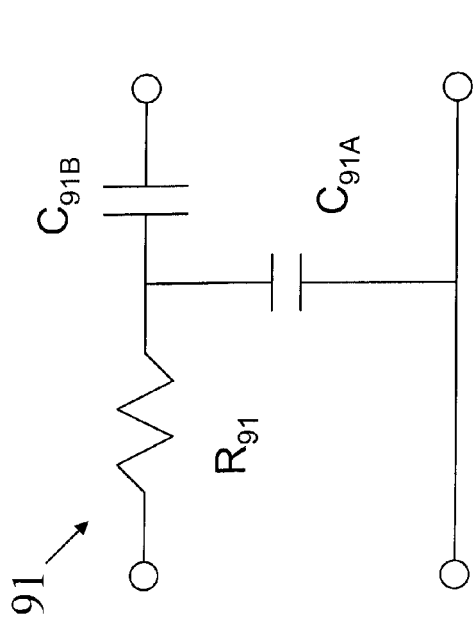
Figure 9B:
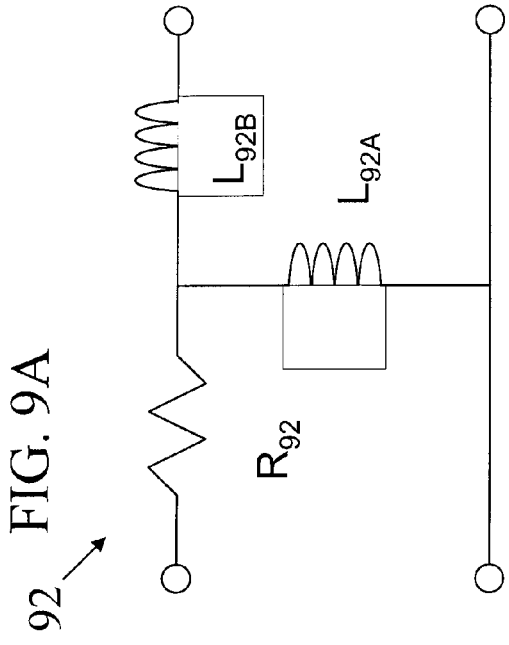

FIGS. 9A to 9D are diagrams of bandpass filters 91 to 94 consistent with the disclosed embodiments. Referring to FIG. 9A, the bandpass filter 91 may include a capacitive-type bandpass filter formed by a resistor, $R_{91}$, and two capacitors, $C_{91A}$ and $C_{91B}$. Referring to FIG. 9B, the bandpass filter 92 may include an inductive-type bandpass filter formed by a resistor, $R_{92}$, and two inductors, $L_{92A}$ and $L_{92B}$. Referring to FIG. 9C, the bandpass filter 93 may include a T-type bandpass filter formed by capacitors, $C_{93A}$-$C_{93C}$, and inductors, $L_{93A}$-$L_{93C}$. Furthermore, referring to FIG. 9D, the bandpass filter 94 may include a Π-type bandpass filter also formed by capacitors, $C_{94A}$-$C_{94C}$, and inductors, $L_{94A}$-$L_{94C}$. In one example, each of the bandpass filters 91 to 94 may replace one or more of the LC filters 71 and 72 described and illustrated with reference to FIGS. 7A and 7B.

FIGS. 10A and 10B are diagrams of surface mount devices 100 and 150. Referring to FIG. 10A, the surface mount device (SMD) 100 may include a first contact 101, a second contact 102 and a third contact 103 in a body 104, and, in accordance with the disclosed embodiments, may be a filter, such as LC filters 71 and 72, or RC filters 81 or 82. Furthermore, the body 104 may include one of a resistor, capacitor and inductor so that the SMD 100 may function to provide resistance, capacitance and inductance, respectively.

Referring to FIG. 10B, the SMD 150 may be similar to the SMD 100 described and illustrated with reference to FIG. 10A except that, for example, a first contact 151 may be coupled to one end of a body 105, and a second contact 152 may be coupled to the other end of the body 105. Similarly, the SMD 150 may function to serve as at least one of a filter, a resistor, a capacitor or an inductor.

FIG. 10C is a schematic diagram of a circuit board 160 with at least one surface mount device consistent with the disclosed embodiments. Referring to FIG. 10C, a first SMD 161 similar to the SMD 100 in FIG. 10A or the SMD 150 in FIG. 10B may be embedded or buried in the substrate 160. Furthermore, a second SMD 162 also similar to the SMD 100 in FIG. 10A or the SMD 150 in FIG. 10B may be mounted on a surface of the substrate 160. To electrically couple the SMD 161 or SMD 162 to a desired planar or SMD component, conductive traces 165 and conductive vias 166 may be required.

Figure 1C:
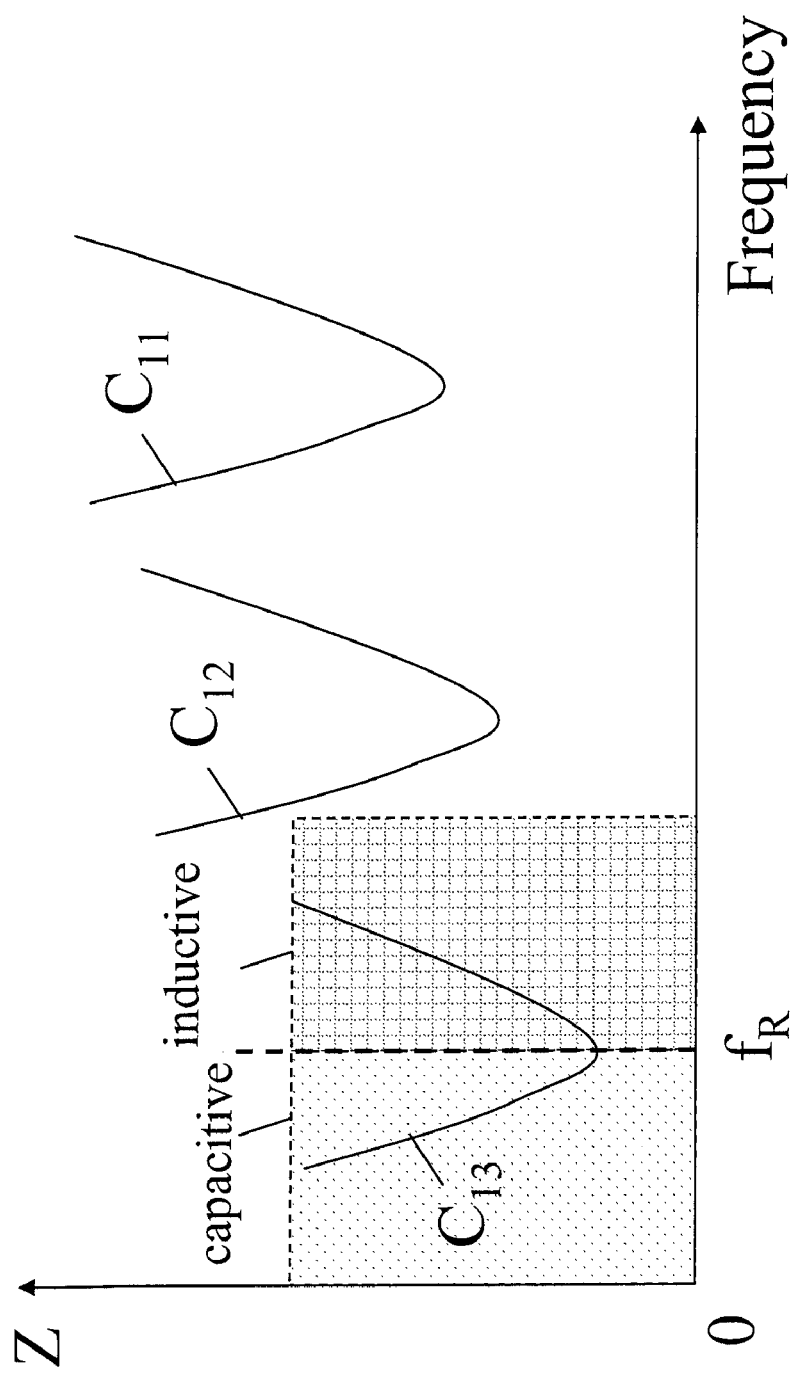
FIG. 1C is a diagram illustrating an impedance curve of the embedded capacitor device illustrated in FIG. 1A.

FIGS. 11A to 11C are schematic diagrams of inductors 170, 180 and 190, consistent with the disclosed embodiments. The inductors 170, 180 and 190 may provide inductance as the planar inductors $L_1$ and $L_2$ illustrated in FIG. 7A and the SMD-type inductor 150 illustrated in FIG. 10B. Referring to FIG. 1A, the inductor 170 may extend in a meandering path. Referring to FIG. 11B, the inductor 180 may extend in a spiral path. Referring to FIG. 11C, the inductor 190 may form a solenoid extending up and down in different layers of a substrate.

Figure 12A:
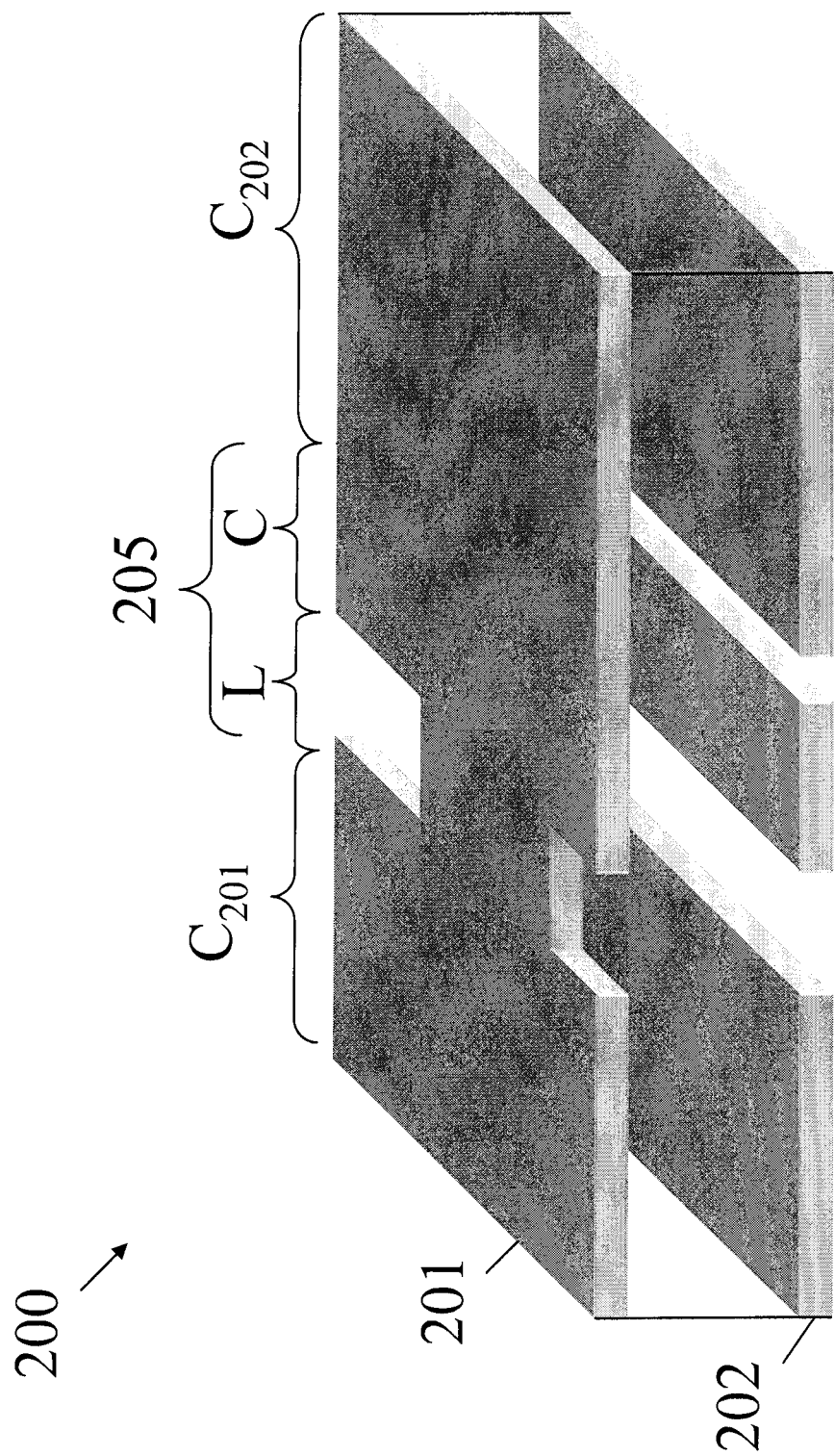
FIG. 12A illustrates a schematic example of a capacitor device shown from a perspective view.

FIG. 12A illustrates a schematic example of an embedded capacitor device 200 shown from a perspective view, consistent with the disclosed embodiments. Referring to FIG. 12A, the embedded capacitor device 200 may include a first conductive plane 201 and a second conductive plane 202 spaced apart from the first conductive plane 201. A first capacitor $C_{201}$, a second capacitor $C_{202}$ and an LC filter 205 of the embedded capacitor device 200 may be formed by, for example, a patterning and etching process on the conductive planes 201 and 202.

Figure 12B:
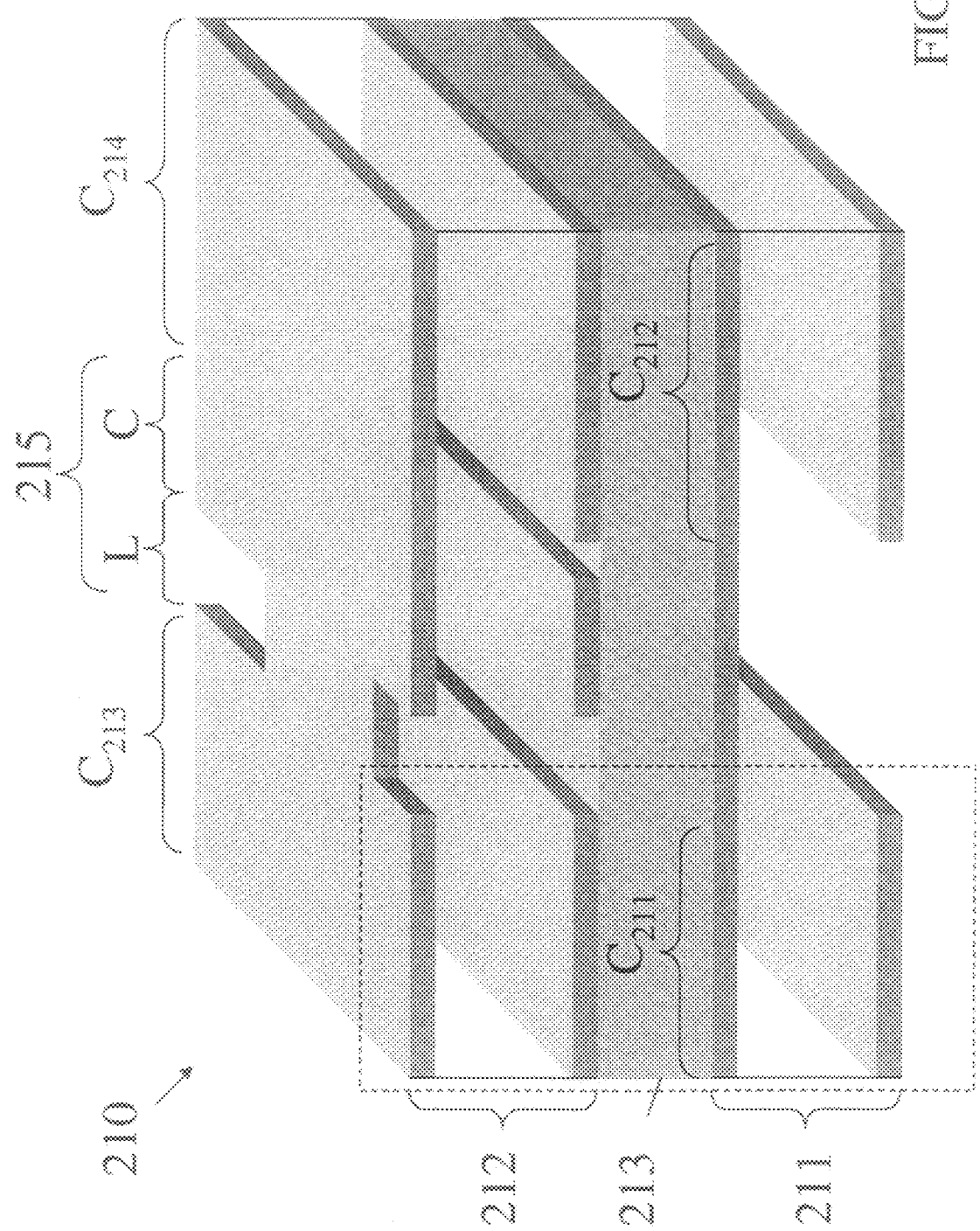
FIG. 12B illustrates another schematic example of a capacitor device shown from a perspective view.

FIG. 12B illustrates another schematic example of an embedded capacitor device 210 shown from a perspective view, consistent with the disclosed embodiments. Referring to FIG. 12B, the embedded capacitor device 210 may include a multi-stack structure. Specifically, the embedded capacitor device 210 may include a first capacitor device 211, a second capacitor device 212 over the first capacitor device 211, and an insulating layer 213 formed between the capacitor devices 211 and 212. The first capacitor device 211 may include a first capacitor $C_{211}$, and a second capacitor $C_{212}$. Likewise, the second capacitor device 212 may include a first capacitor $C_{213}$ and a second capacitor $C_{214}$. The first capacitors $C_{211}$ and $C_{213}$ may be electrically coupled in parallel to each other, which may provide an increased capacitance. Moreover, the second capacitors $C_{212}$ and $C_{214}$ may be electrically coupled in parallel, which may provide an increased capacitance. Furthermore, the second capacitor device 212 may include an LC filter 215 similar to the LC filter 205 illustrated in FIG. 12A. The LC filter 215 may facilitate conducting switching noise to one of the capacitors $C_{211}$, $C_{212}$, $C_{213}$ and $C_{214}$ in the multi-stack capacitor structure.

Although the embedded capacitor device 210 in the present example includes a two-stack and one-filter structure, skilled persons in the art will understand that in other examples consistent with the disclosed embodiments of embedded capacitor device 210 may include a capacitor structure having three or more stacks. Furthermore, in still other examples, the second capacitor device 212 may include two or more filters.

Figure 12C:
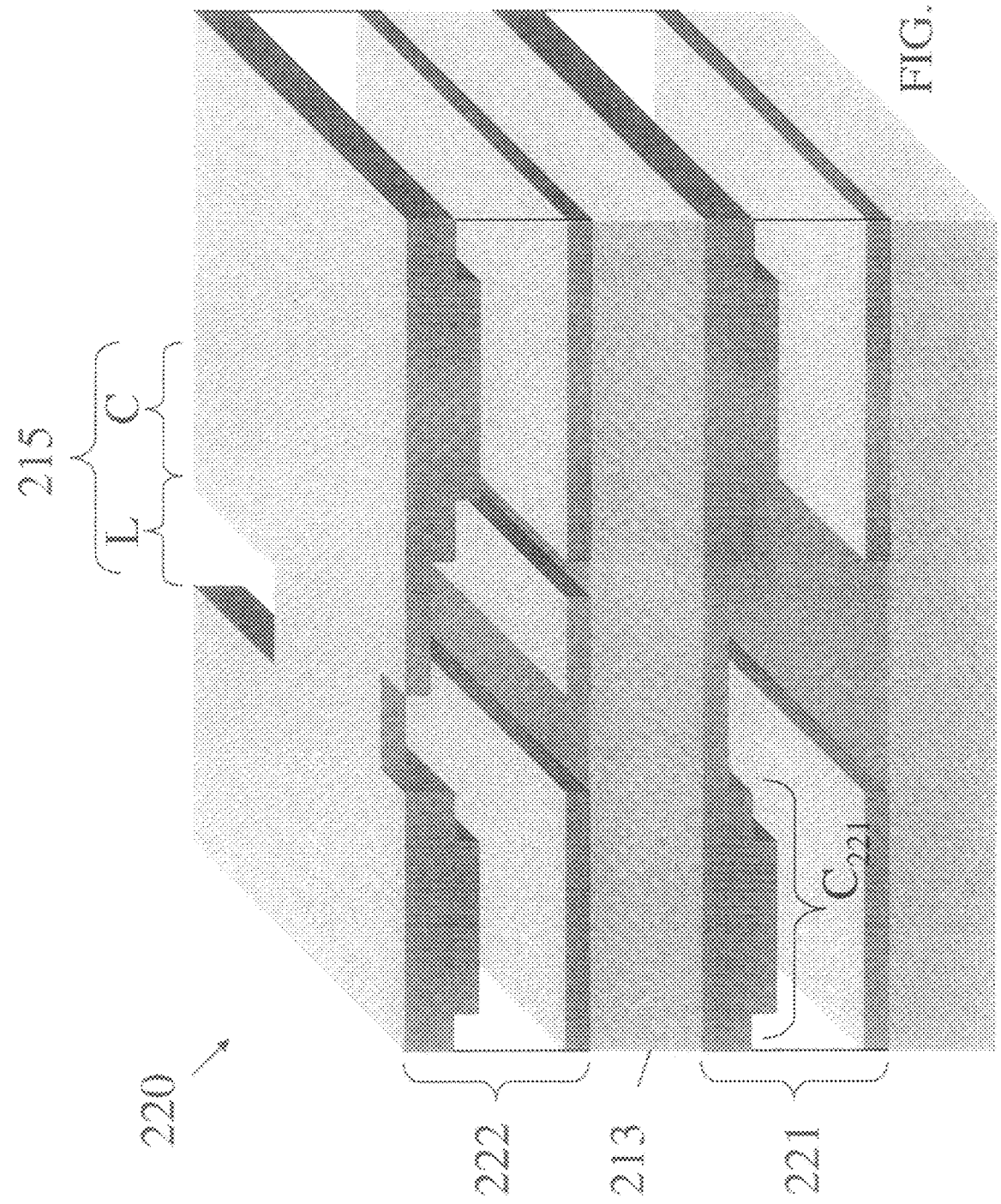
FIG. 12C illustrates still another schematic example of a capacitor device shown from a perspective view.

FIG. 12C illustrates still another schematic example of an embedded capacitor device 220 shown from a perspective view. Referring to FIG. 12C, the embedded capacitor device 220 may be similar to the embedded capacitor device 210 described and illustrated with reference to FIG. 12B except that, for example, a first capacitor device 221 and a second capacitor device 222 may replace the first capacitor device 211 and the second capacitor device 212, respectively. As illustrated in FIG. 12C, each of the first capacitor device 221 and the second capacitor device 222 may include a multi-tier structure that provides for tunable capacitance and induction using a combination of contacts to first and second capacitor devices 221 and 222. For instance, a first capacitor $C_{221}$ may include a two-tier capacitor structure. In other examples, at least one of the first capacitor device 221 or the second capacitor device 222 may include a single-tier structure.

Figure 12D:
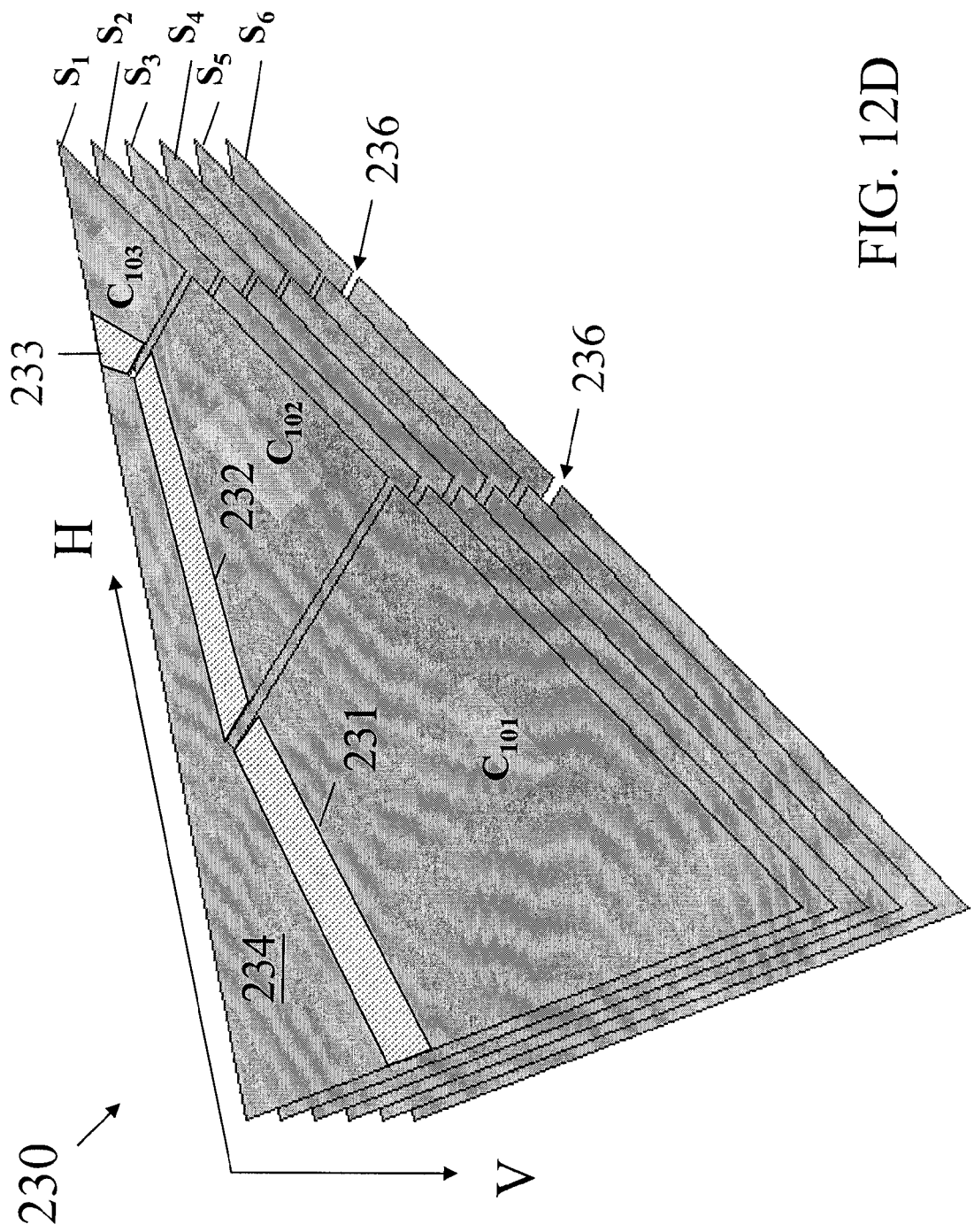
FIG. 12D illustrates yet another schematic example of a capacitor device shown from a perspective view.

FIG. 12D illustrates yet another schematic, consistent with the disclosed embodiments, of an embedded capacitor device 230 shown from a perspective view. Referring to FIG. 12D, the embedded capacitor device 230 may include a stack of electrodes $S_1$ to $S_6$ in a vertical direction V. Although embedded capacitor device 230 shown in FIG. 12D includes six electrodes $S_1$-$S_6$, more or less electrodes may be used. For example, embedded capacitor device 230 may have as few as two stacked electrodes. In accordance with the disclosed embodiments, the electrodes $S_1$, $S_3$ and $S_5$ may be coupled to a power plane (not shown) while the electrodes to $S_2$, $S_4$ and $S_6$ may be coupled to a ground plane (not shown) so that a capacitor may be defined between each of the electrode pairs $S_1$ and $S_2$, $S_3$ and $S_4$, and $S_5$ and $S_6$. Furthermore, each of the electrodes $S_1$ to $S_6$ may include capacitor sections separated from one another in a horizontal direction H. For example, the electrode $S_1$ may be divided into three capacitor sections $C_{101}$, $C_{102}$ and $C_{103}$. In one example, a first filter 231 may be coupled between the capacitor section $C_{101}$ and an entry region 234 on the electrode plane $S_1$, a second filter 232 may be coupled between the capacitor section $C_{102}$ and the entry region 234, and a third filter 233 may be coupled between the third capacitor section $C_{103}$ and the entry region 234. Each of the filters 231 to 233 may include one of a discrete filter such as an SMD filter, an embedded filter, or a buried filter. Moreover, individual components of filters 231 to 233 may include one of a discrete-type device, an embedded-type device, or a buried-type device and may be formed of the various discussed resistors, capacitors and inductors.

A capacitor device in accordance with the disclosed embodiments may be utilized in a structure which may be in the form of a substrate such as a silicon substrate, a chip carrier, a ceramic substrate, a glass substrate, a flexible substrate, or a printed circuit board. The application may also be utilized in a package structure such as an integrated circuit package structure, a system in a package (SIP) structure, a system on a package (SOP) structure, a system on a module (SOM) structure, a three-dimensional (3D) package, structure, a package on a package (POP) structure, a carrier stacking structure, or a socket structure.

Furthermore, in describing representative examples consistent with the disclosed embodiments, the specification may have presented a method and/or process of the disclosed embodiments as a particular sequence of steps. However, to the extent that any method or process described here does not rely on the particular order of steps set forth herein, the method or process should not be limited to the particular sequence of steps described. As one of ordinary skill in the art would appreciate, other sequences of steps may be possible. Therefore, the particular order of the steps set forth here should not be construed as limitations on the claims. In addition, any claims directed to the method and/or process consistent with the disclosed embodiments should not be limited to the performance of their steps in the order written, and one skilled in the art can readily appreciate that the sequences may be varied and still remain within the spirit and scope of the disclosed embodiments.

It will be appreciated by those skilled in the art that changes could be made to the examples described above without departing from the broad inventive concept thereof. It is understood, therefore, that embodiments consistent with the present invention are not limited to the particular examples disclosed, but that it is intended to cover modifications within the spirit and scope of the disclosed embodiments as defined by the appended claims.

What is claimed is:

1. A capacitor device, comprising:
a first capacitor; and
a first filter coupling the first capacitor and a conductive region, wherein
the first capacitor has a first resonance frequency and the first filter is configured to operate at a first frequency band covering the first resonance frequency; and
the first filter conducts noise from the conductive region to the first capacitor if the noise falls within the first frequency band.

2. The capacitor device according to claim 1, further comprising a second capacitor, the second capacitor being coupled to the conductive region.

3. The capacitor device of claim 2, further comprising:
a second filter coupling the second capacitor and the conductive region; and
a third capacitor, the third capacitor coupled to the second capacitor via a third filter, wherein
the second capacitor has a second resonance frequency and the second filter is configured to operate at a second frequency band covering the second resonance frequency, and
the third capacitor has a third resonance frequency and the third filter is configured to operate at a third frequency band covering the third resonance frequency.

4. The capacitor device of claim 2, further comprising:
a second filter, wherein the second capacitor is coupled to the conductive region via the second filter, and
the first filter serves as a low-pass filter and the second filter serves as a high pass filter.

5. The capacitor device of claim 2, further comprising a second filter, wherein the second capacitor is coupled to the conductive region via the second filter, and at least one of the first filter and the second filter serves as a band pass filter.

6. The capacitor device of claim 2, further comprising a second filter coupled to the conductive region, wherein at least one of the first filter and the second filter comprise one of an SMD filter, a buried filter, a planar filter and an embedded filter.

7. The capacitor device of claim 2, further comprising:
a second filter coupling the second capacitor to the conductive region, the second capacitor having a second resonance frequency and the second filter being configured to operate at a second frequency band covering the second resonance frequency; and
a third capacitor coupled to the conductive region by a third filter having a third resonance frequency, the third filter being configured to operate at a third frequency band covering the third resonance frequency.

8. The capacitor device according to claim 1, further comprising:
a second capacitor; and
a second filter coupling a second capacitor and the conductive region, wherein
the second capacitor has a second resonance frequency and the second filter is configured to operate at a second frequency band covering the second resonance frequency.

9. The capacitor device according to claim 8, wherein the second filter conducts noise from the conductive region to the second capacitor if the noise falls within the second frequency band.

10. The capacitor device of claim 1 further comprising
a second capacitor;
a third capacitor; and
a second filter coupling a second capacitor and the conductive region, wherein
the second capacitor has a second resonance frequency and the second filter is configured to operate at a second frequency band covering the second resonance frequency; and
the third capacitor is coupled to the conductive region, and has a third resonance frequency.

11. The capacitor device of claim 1, further comprising a second capacitor coupled to the conductive region, wherein at least one of the first capacitor and the second capacitor comprise one of a surface mount device (SMD) capacitor, an embedded capacitor, a buried capacitor and a planar capacitor.

12. The capacitor device according to claim 1, wherein the capacitor device is coupled to a substrate.

13. The capacitor device according to claim 12, wherein the substrate is a silicon substrate, a chip carrier, a ceramic substrate, a flexible substrate, or a printed circuit board.

14. The capacitor device according to claim 12, wherein the capacitor device is buried or embedded in the substrate.

15. The capacitor device according to claim 1, wherein the conductive region acts as a second capacitor.

16. A capacitor device, comprising:
a first filter coupling a first capacitor to a conductive region; and
a second filter coupling a second capacitor to the first capacitor, wherein
the first capacitor has a first resonance frequency;
the first filter is configured to operate at a first frequency band covering the first resonance frequency;
the second capacitor has a second resonance frequency and is serially coupled to the first capacitor via the second filter;
the second filter is configured to operate at a second frequency band covering the second resonance frequency;
the first filter conducts noise from the conductive region to the first capacitor if the noise falls within the first frequency band; and
the second filter conducts noise from the first capacitor to the second capacitor if the noise falls within the second frequency band.

17. The capacitor device according to claim 16, further comprising
a third capacitor coupled to the conductive region.

18. The capacitor device according to claim 17, further comprising a third filter provided between the third capacitor and the conductive region, the third filter being configured to operate at a third frequency band covering the third resonance frequency.

19. The capacitor device according to claim 16, wherein the capacitor device is coupled to a substrate.

20. The capacitor device according to claim 19, wherein
the substrate is a silicon substrate, a chip carrier, a ceramic substrate, a glass substrate, a flexible substrate, or a printed circuit board.

21. The capacitor device according to claim 19, wherein the capacitor device is embedded or buried in the substrate.

22. The capacitor device according to claim 16, wherein at least one of the first capacitor and the second capacitor comprise one of a surface mount device (SMD) capacitor, an embedded capacitor, a buried capacitor, and a planar capacitor.

23. The capacitor device according to claim 16, wherein at least one of the first filter and the second filter comprise one of an SMD filter, a buried filter, a planar filter, and an embedded filter.

24. The capacitor device according to claim 16, wherein the conductive region acts as a third capacitor.

* * * * *